(12) United States Patent
Sato et al.

(10) Patent No.: US 9,253,877 B2
(45) Date of Patent: Feb. 2, 2016

(54) WIRING SUBSTRATE AND SEMICONDUCTOR DEVICE

(71) Applicant: Shinko Electric Industries Co., Ltd., Nagano-ken (JP)

(72) Inventors: Takashi Sato, Nagano (JP); Ruofan Tang, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/633,342

(22) Filed: Feb. 27, 2015

(65) Prior Publication Data

US 2015/0257256 A1 Sep. 10, 2015

(30) Foreign Application Priority Data

Mar. 10, 2014 (JP) ................. 2014-046565

(51) Int. Cl.
| | | |
|---|---|---|
| H01L 23/544 | (2006.01) | |
| H01L 23/12 | (2006.01) | |
| H05K 1/02 | (2006.01) | |
| H01L 23/498 | (2006.01) | |
| H05K 1/11 | (2006.01) | |

(52) U.S. Cl.
CPC ........ H05K 1/0269 (2013.01); H01L 23/49822 (2013.01); H01L 23/49827 (2013.01); H01L 23/544 (2013.01); H05K 1/115 (2013.01); H01L 2223/5442 (2013.01); H01L 2223/54406 (2013.01); H01L 2223/54426 (2013.01); H01L 2223/54433 (2013.01); H01L 2223/54486 (2013.01); H01L 2224/16225 (2013.01); H01L 2224/32225 (2013.01); H01L 2224/73204 (2013.01)

(58) Field of Classification Search
CPC ............ H01L 23/544; H01L 23/49827; H01L 23/49833; H01L 23/49822; H01L 2224/16225; H01L 2224/32221; H01L 2224/32225
USPC .................. 257/700, 797, E23.019, E23.179; 174/250, 258, 267
See application file for complete search history.

(56) References Cited

U.S. PATENT DOCUMENTS

| | | | |
|---|---|---|---|
| 6,528,874 B1 * | 3/2003 | Iijima et al. ................... | 257/700 |
| 2005/0170631 A1 * | 8/2005 | Yuri .............................. | 438/618 |
| 2007/0057363 A1 * | 3/2007 | Nakamura et al. ............ | 257/698 |
| 2009/0205860 A1 * | 8/2009 | Kobayashi .................... | 174/260 |
| 2011/0316148 A1 * | 12/2011 | Kondo et al. ................. | 257/737 |

FOREIGN PATENT DOCUMENTS

JP 2009-194321 8/2009

* cited by examiner

*Primary Examiner* — Jasmine Clark
(74) *Attorney, Agent, or Firm* — Fish & Richardson P.C.

(57) ABSTRACT

A wiring substrate includes wiring layers and insulation layers alternately stacked. Via holes are formed in the insulation layers. First via wirings are formed in the via holes to electrically connect the wiring layers to one another. Through holes extend through a lowermost one of the insulation layers in a thickness direction. The lowermost insulation layer covers a lowermost one of the wiring layers. Second via wirings are formed in the through holes to define an identification mark that is identifiable as a specific shape including a character, a symbol, or a combination thereof. A lower surface of each of the second via wirings is exposed from a lower surface of the lowermost insulation layer and is flush with a lower surface of the lowermost wiring layer.

8 Claims, 18 Drawing Sheets

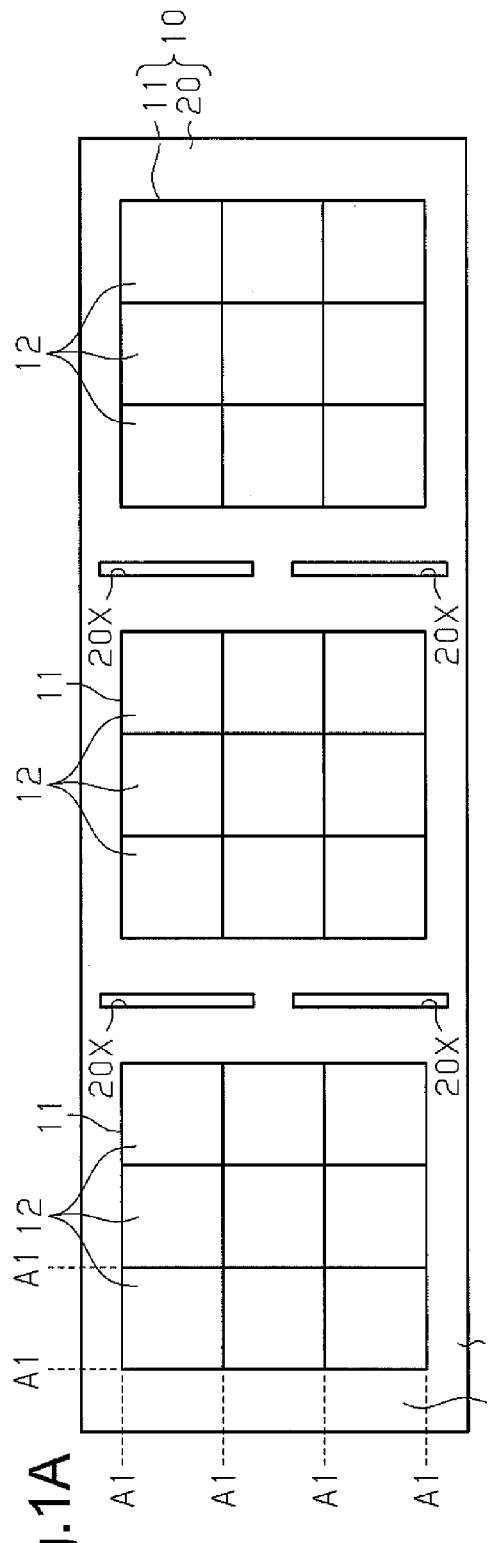
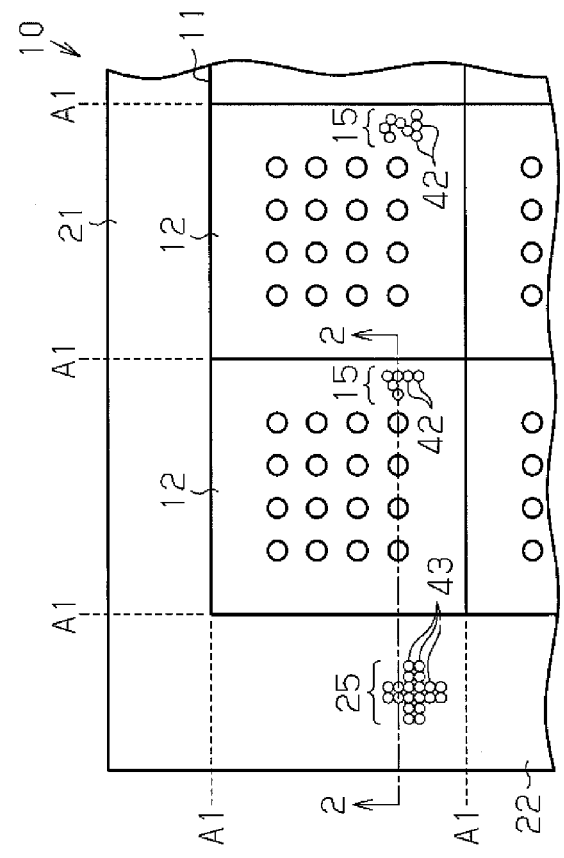

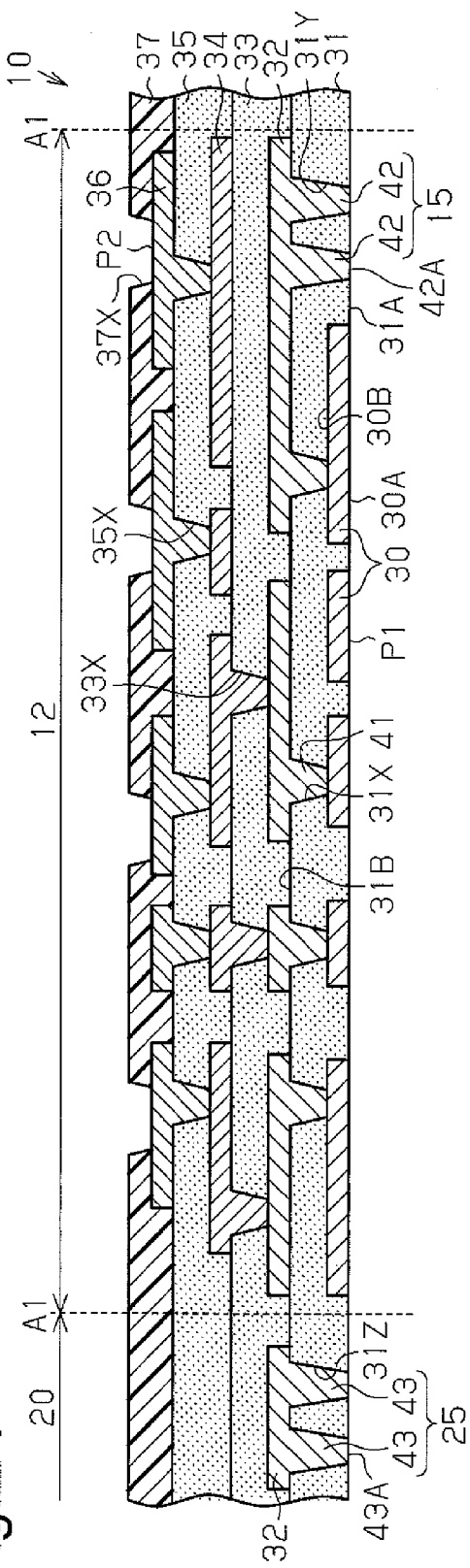
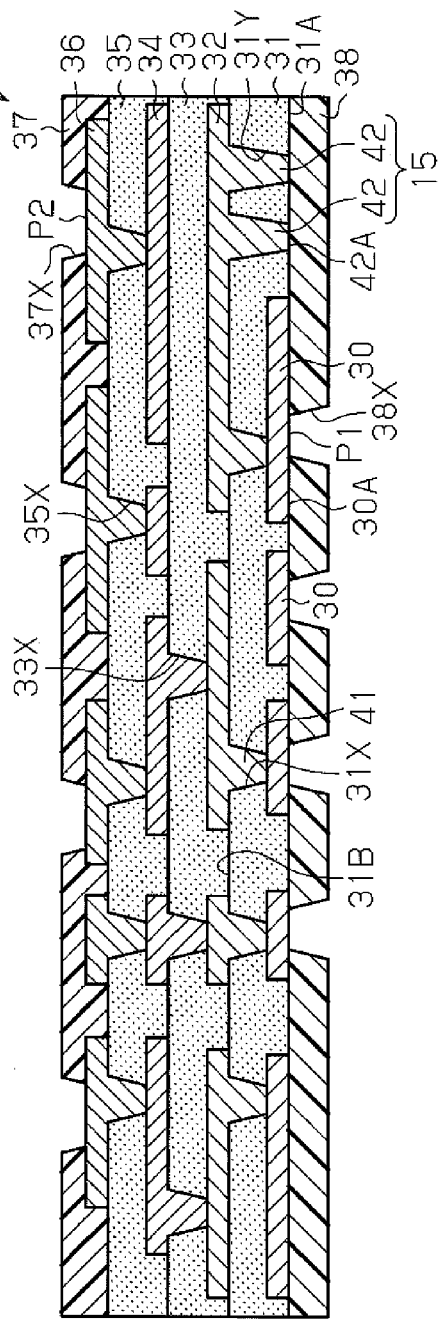
Fig.2A
Fig.2B

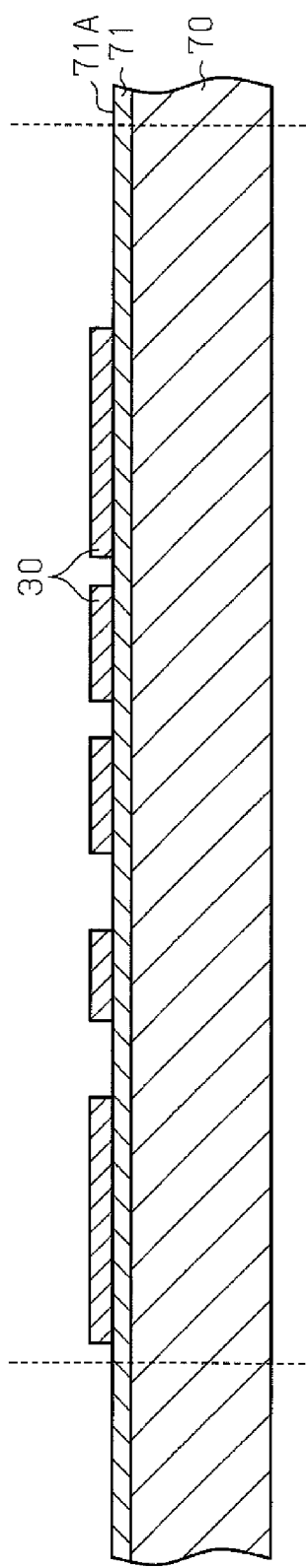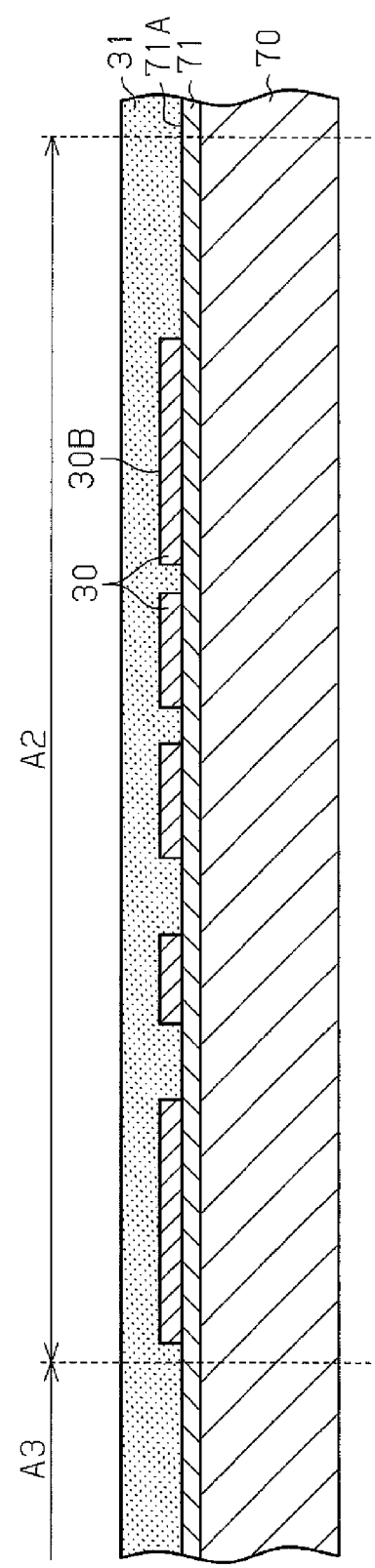

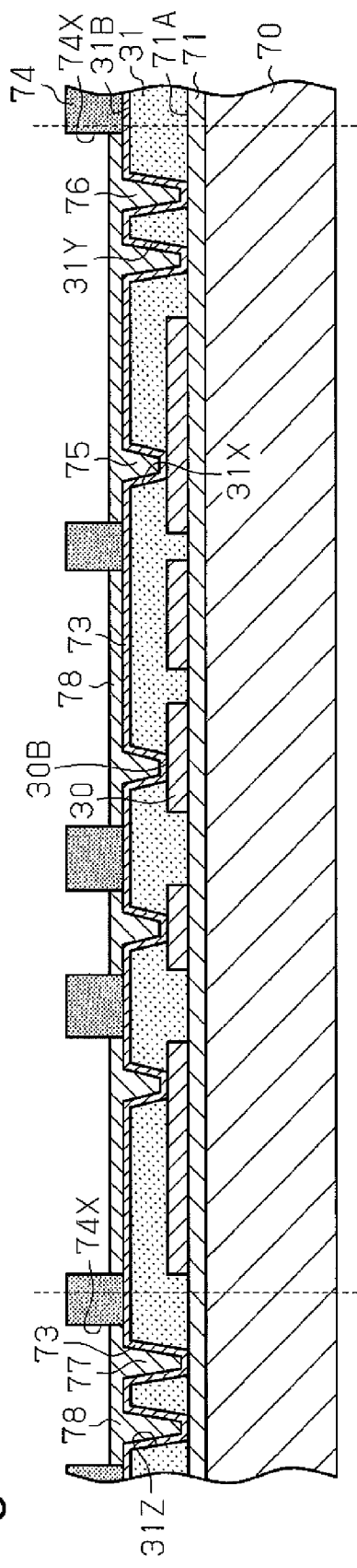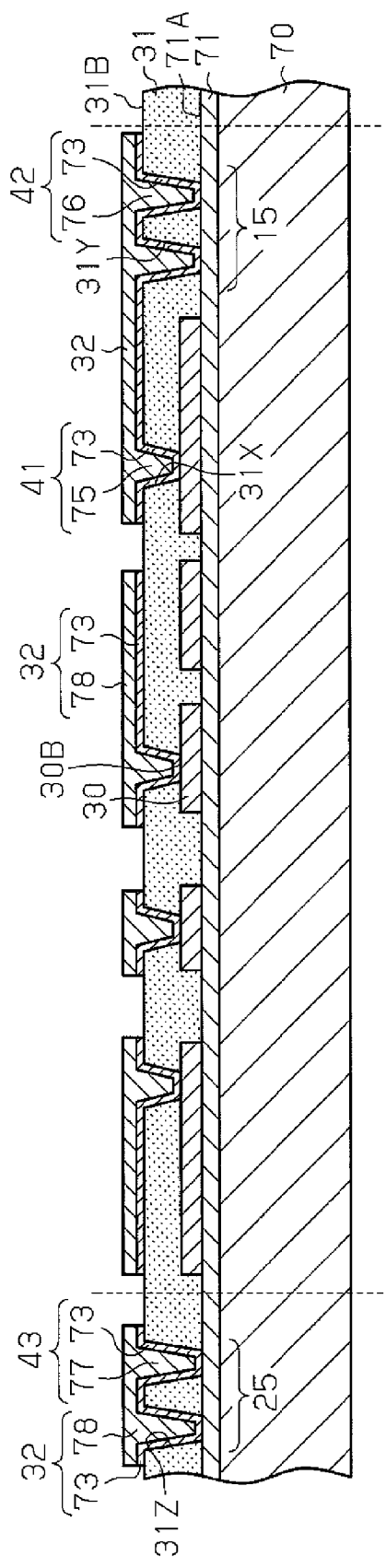

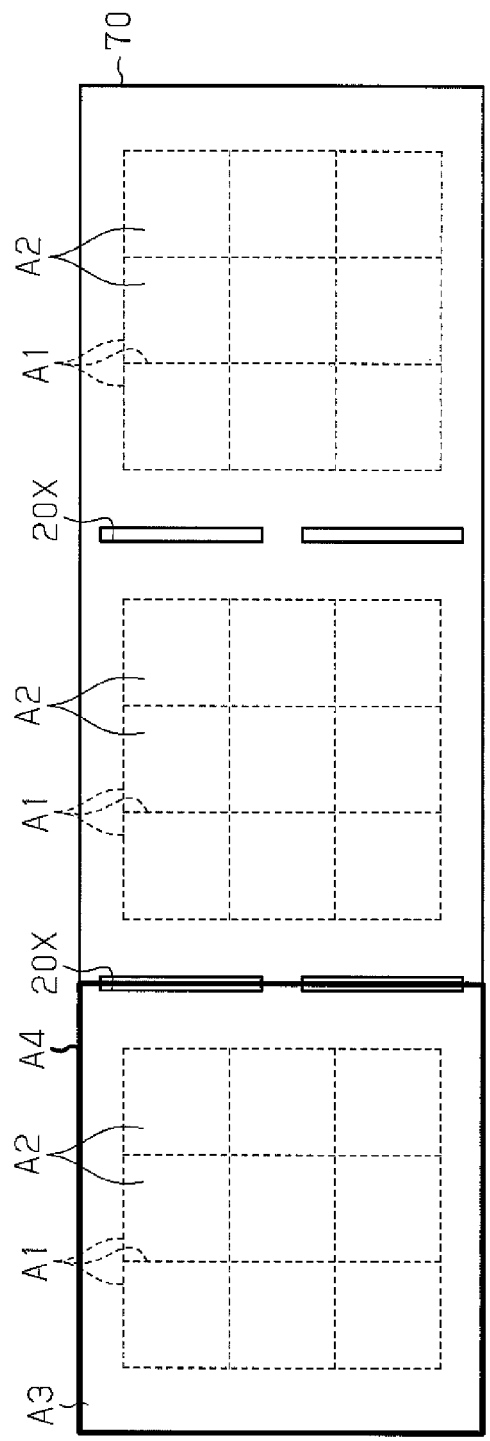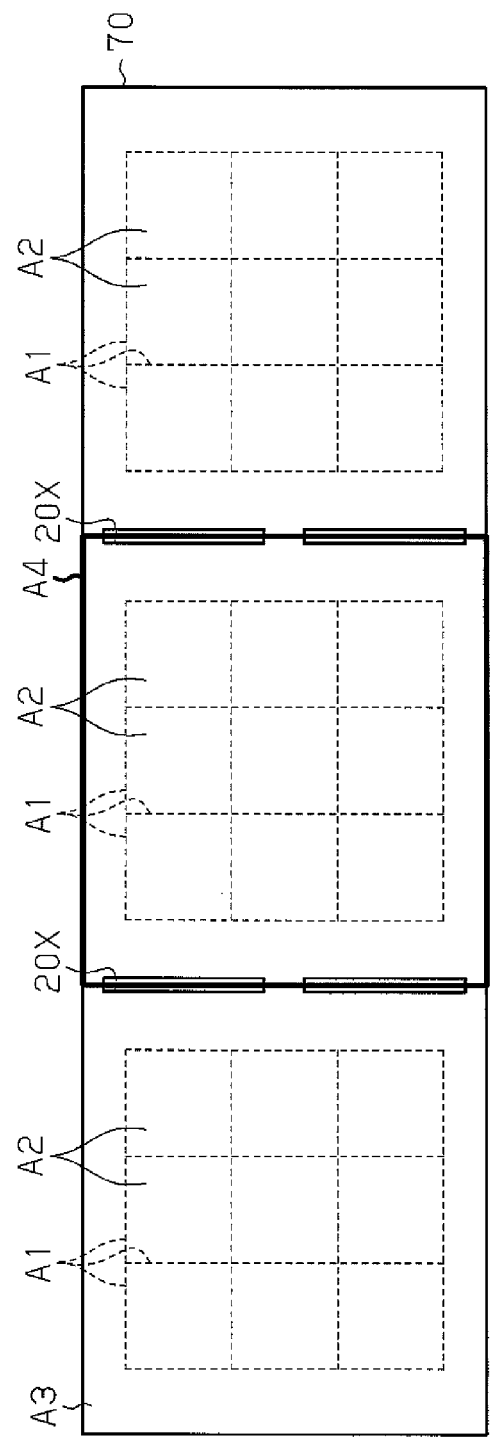

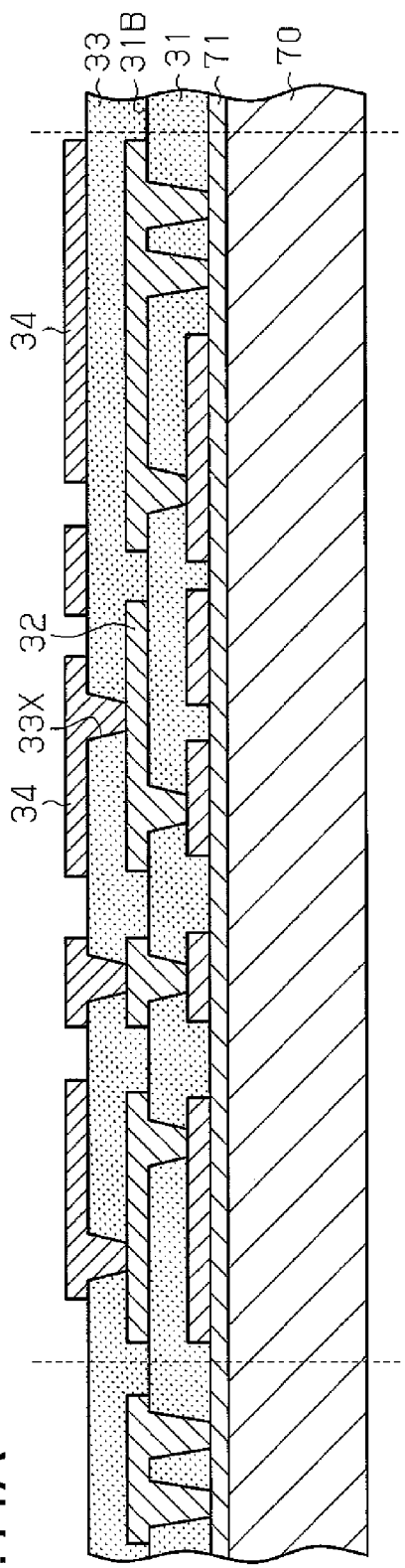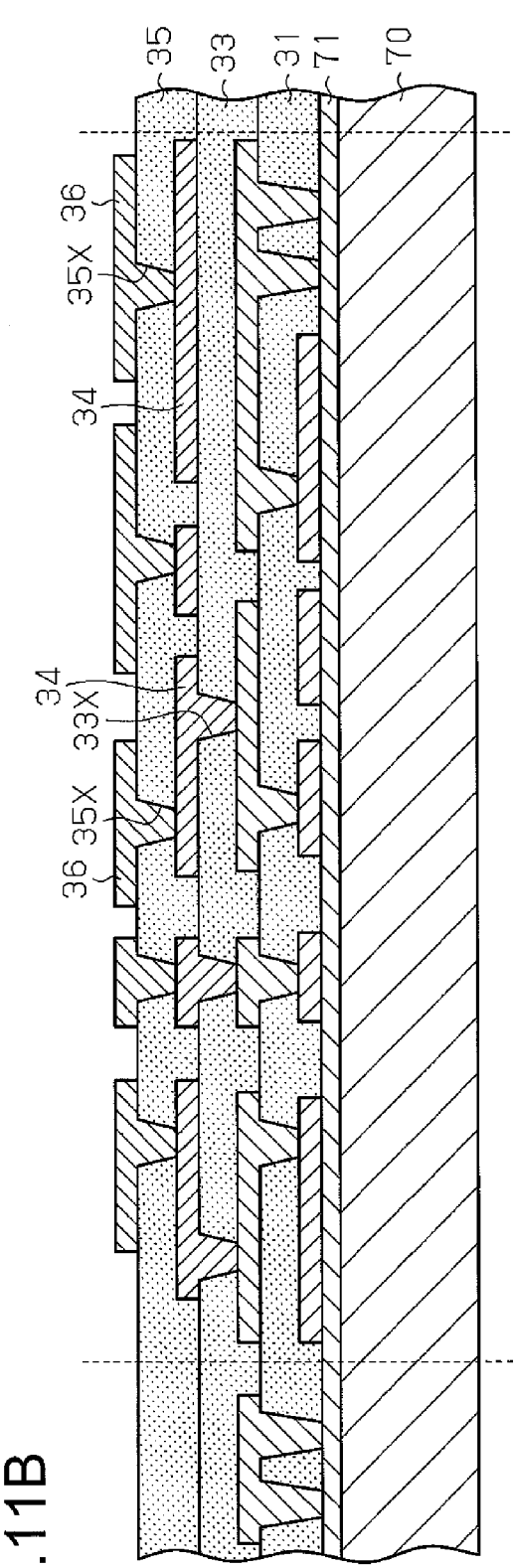
Fig.11A
Fig.11B

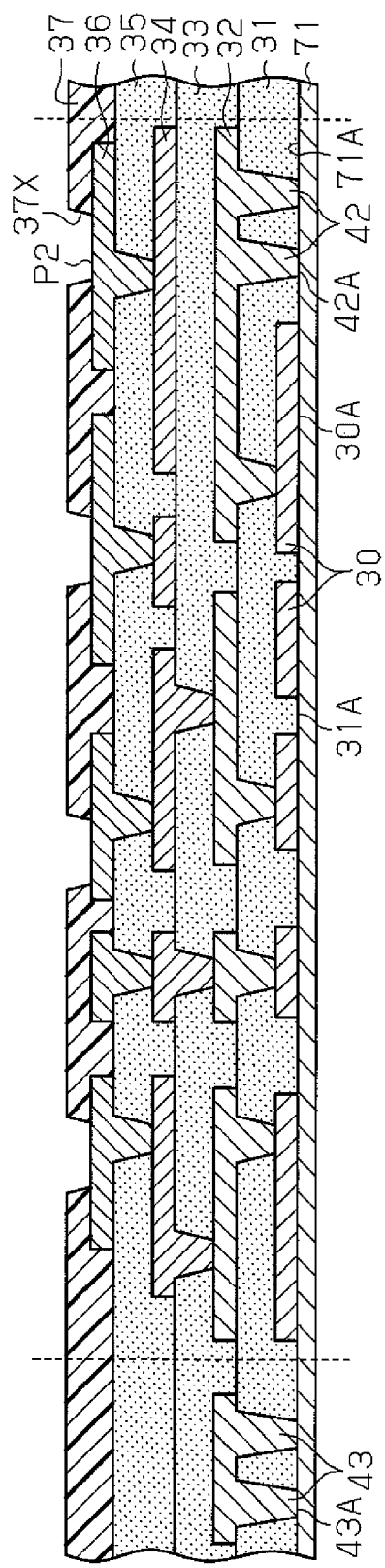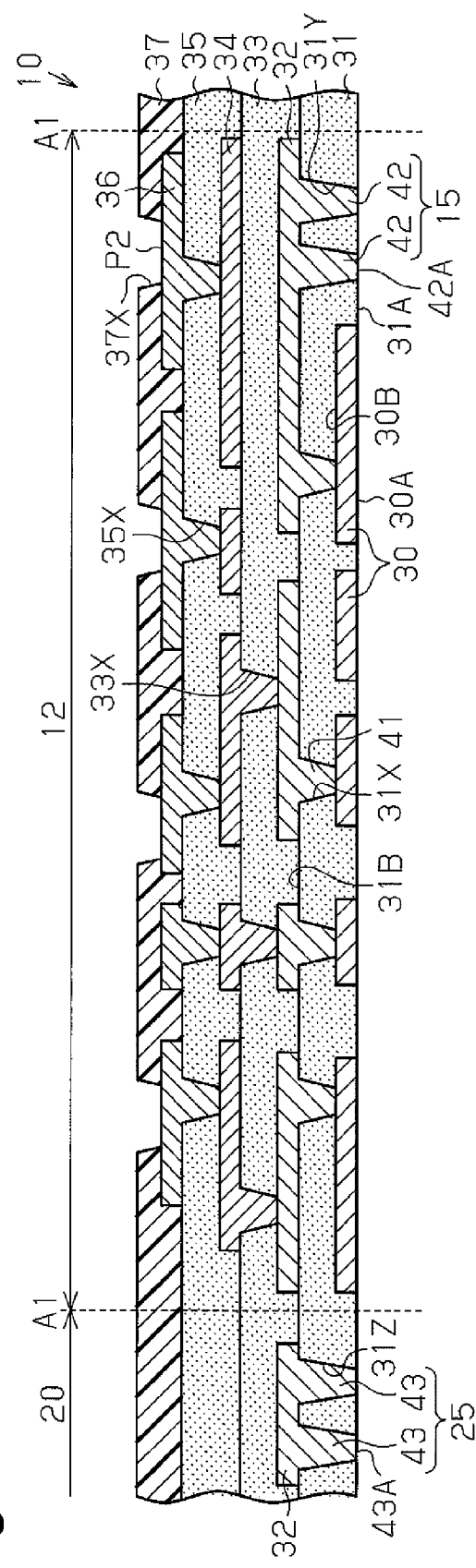

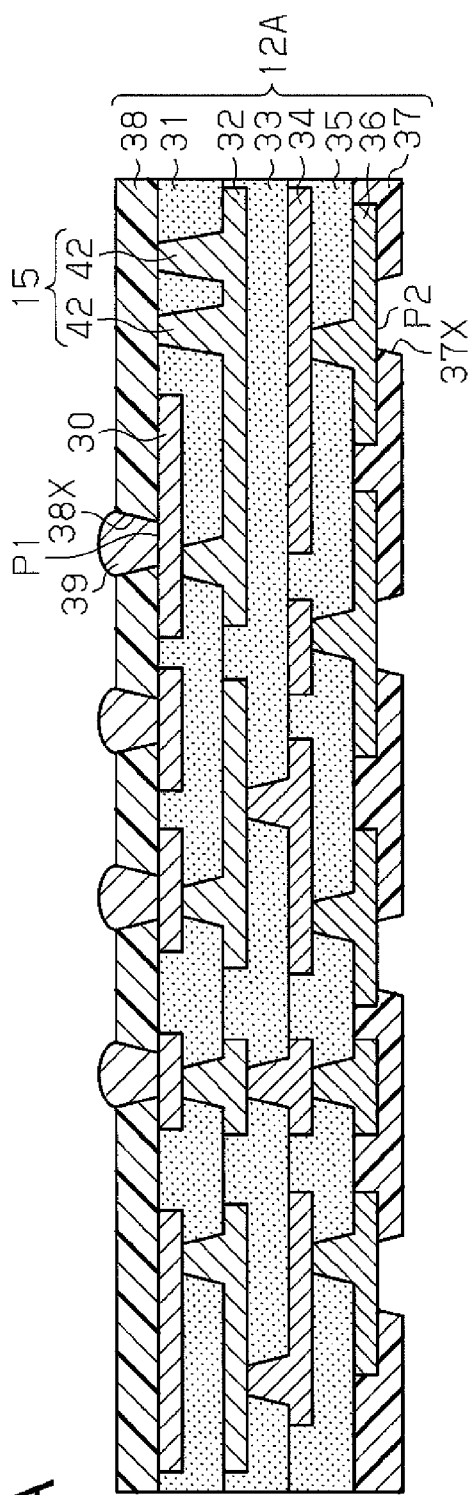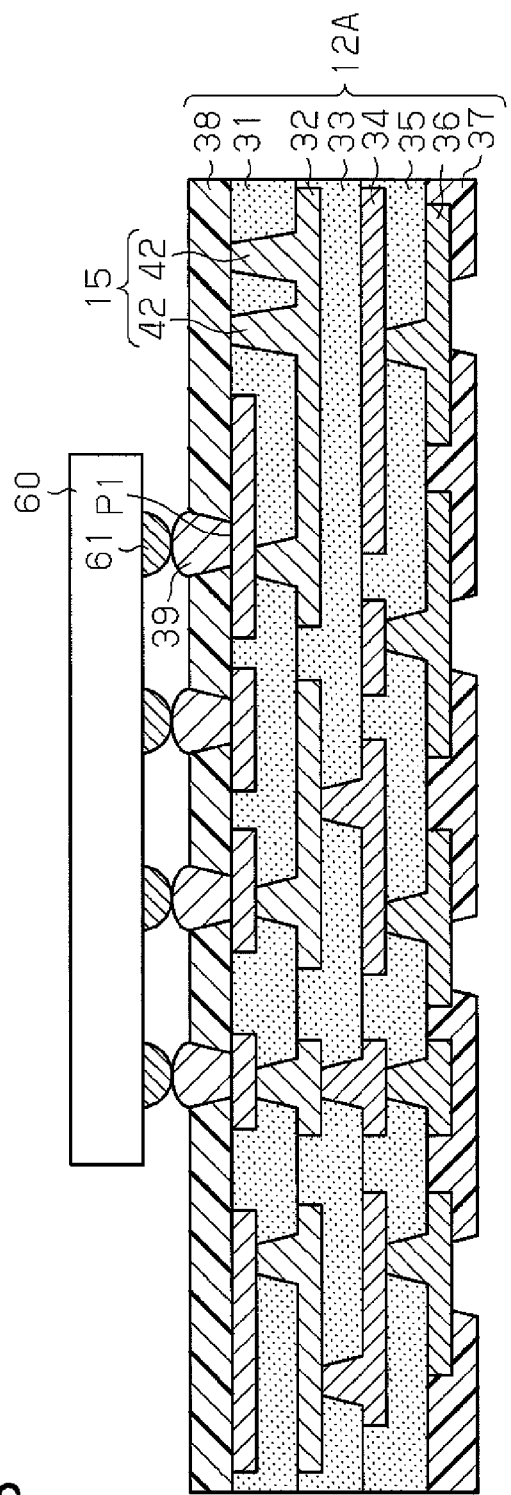

(Related Art)

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2014-046565, filed on Mar. 10, 2014, the entire contents of which are incorporated herein by reference.

FIELD

This disclosure relates to a wiring substrate, a semiconductor device, and a method of manufacturing a wiring substrate.

BACKGROUND

In recent years, wiring substrates used for mounting of electronic components such as semiconductor chips have been decreased in size and increased in density. Japanese Laid-Open Patent Publication No. 2009-194321 describes a technique of acquiring a plurality of unit wiring substrates from a large-sized wiring substrate.

As illustrated in FIG. 18, a large-sized wiring substrate 80 includes a plurality of unit wiring substrates 81 (here, 9 unit wiring substrates) and an outer frame 82 surrounding the unit wiring substrates 81. The wiring substrate 80 is cut at cutting positions A10 and fragmentized into the unit wiring substrates 81.

An identification mark 83 that is identified as a specific character or symbol at a planar view is formed on each of the unit wiring substrates 81. In the example illustrated in FIG. 18, the identification marks 83 are identified as "B1" to "B9" at a planar view. For example, each of the identification marks 83 indicates position information or lot information of the corresponding unit wiring substrate 81. An example of a method of forming the identification mark 83 will now be described below.

First, a provisional substrate serving as a support substrate is prepared. Then, a wiring layer including a plurality of pads is formed on the provisional substrate. Then, a required number of wiring layers and a required number of insulation layers are sequentially stacked using a build-up technique, and a number of through holes are formed in the uppermost one of the insulation layers. The through holes form the identification mark 83 identifiable as a specific shape at a planar view. In the example illustrated in FIG. 18, the through holes form the identification mark 83 identifiable as, for example, "B1".

SUMMARY

The visibility of the identification mark formed by the through holes is not sufficient. Thus, there is a room for improvement in visibility of the identification mark.

One aspect of this disclosure is a wiring substrate includes wiring layers and insulation layers alternately stacked. Via holes are formed in the insulation layers. First via wirings are formed in the via holes to electrically connect the wiring layers to one another. Through holes extend through a lowermost one of the insulation layers in a thickness direction. The lowermost insulation layer covers a lowermost one of the wiring layers. Second via wirings are formed in the through holes to define an identification mark that is identifiable as a specific shape including a character, a symbol, or a combination thereof. A lower surface of each of the second via wirings is exposed from a lower surface of the lowermost insulation layer and is flush with a lower surface of the lowermost wiring layer Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic plan view illustrating a wiring substrate according to one embodiment;

FIG. 1B is an enlarged plan view partially illustrating the wiring substrate of FIG. 1A;

FIG. 2A is a schematic cross-sectional view of the wiring substrate taken along line 2-2 in FIG. 1B;

FIG. 2B is a schematic cross-sectional view of a unit wiring substrate illustrated in FIG. 2A;

FIGS. 5A, 5B, 6A, 6B, 7A, 7B, 8A, 8B, 9A, 9B, 10A, 10B, 11A, 11B, 12, 13A, 13B, 14A, and 14B are schematic cross-sectional views illustrating a method of manufacturing the wiring substrate of FIG. 1A;

FIGS. 15A and 15B are schematic cross-sectional views illustrating a method of manufacturing the semiconductor device of FIG. 4;

DESCRIPTION OF THE EMBODIMENTS

Figure 3A:
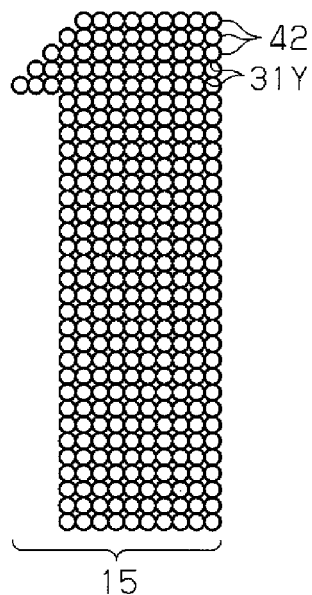
FIGS. 3A to 3D are schematic plan views illustrating various identification marks.

One embodiment will now be described with reference to the drawings. In the drawings, elements are illustrated for simplicity and clarity and have not necessarily been drawn to an actual scale. To facilitate understanding, hatching lines of some elements may not be illustrated in the cross-sectional drawings.

First, the structure of a wiring substrate 10 will now be described with reference to FIGS. 1A to 3D.

As illustrated in FIG. 1A, the wiring substrate 10 is, for example, a sheet-like wiring substrate. For example, the wiring substrate 10 is formed substantially in a rectangular shape at a planar view. The wiring substrate 10 includes a plurality of (for example, three) blocks 11 and an outer frame 20 surrounding the blocks 11. The blocks 11 are separated from one another by the outer frame 20. A plurality of unit wiring substrates 12 (hereinafter, referred to as "wiring substrates 12") is formed in each of the blocks 11 in a matrix form (for example, 3×3). The wiring substrate 10 is cut at cutting positions A1 and fragmentized into the wiring substrates 12. The outer frame 20 is discarded after the wiring substrates 10 are cut.

As illustrated in FIG. 1B, an identification mark 15 is formed in each of the wiring substrates 12. The identification mark 15 is identifiable as a specific shape, which includes a character, a symbol, or a combination thereof, at a planar view. In the example illustrated in FIG. 1B, the identification mark 15 formed in the wiring substrate 12 on the upper left of the block 11 is identifiable as "1". The identification mark 15 formed in the wiring substrate 12 on the right of the identification mark 15 identified as "1" is identifiable as "2". The identification mark 15 is also formed in each of the wiring substrates 12 that are not illustrated in FIG. 1B. The identification mark 15 is used, for example, when a certain defect has occurred after the wiring substrate 10 is fragmentized into the wiring substrates 12. For example, by using the identification mark 15, it is possible to specify the wiring substrate 12 in which a defect has occurred among the wiring substrates 12 arranged in the wiring substrate 10. This allows for analyzing whether a defect has occurred depending on a specific location in the wiring substrate 10 or due to a specific manufacturing process. As the identification mark 15, for example, an identification number, coordinates information, a lot number, a serial number, a drawing number, a product name, a specific mark (e.g., an alignment mark), and the like may be used. In FIG. 1B, the identification mark 15 is simplified and illustrated.

As illustrated in FIG. 1A, the outer frame 20 includes two rail portions 21 extending in the longitudinal direction (the horizontal direction in FIG. 1A) and a plurality of rail portions 22 extending in the width direction (the vertical direction in FIG. 1A). A plurality of (here, two) slits 20X extending in the width direction is formed in the rail portion 22 positioned between the adjacent blocks 11. For example, the slits 20X extend through the rail portion 22 (that is, the wiring substrate 10).

As illustrated in FIG. 1B, identification marks 25 are formed in the rail portions 22. Each of the identification marks 25 is identifiable as a specific shape, which includes a character, a symbol, or a combination thereof, at a planar view. In the example illustrated in FIG. 1B, the identification mark 25 identifiable as "+" is formed in the rail portion 22 on the left side of the block 11. Although FIG. 1B illustrates one identification mark 25, a number of different types of identification marks 25 are formed in the rail portions 22. Further, although not illustrated in FIG. 1B, a number of different types of identification marks 25 are formed in the rail portions 21 as well. The identification mark 25 is used to identify one of the blocks 11. Similarly to the identification mark 15, as the identification mark 25, for example, an identification number, coordinates information, a lot number, a serial number, a drawing number, a product name, a specific mark (e.g., an alignment mark), and the like may be used. In FIG. 1B, the identification mark 25 is simplified and illustrated.

As illustrated in FIG. 2A, the wiring substrate 10 includes a wiring layer 30, an insulation layer 31, a wiring layer 32, an insulation layer 33, a wiring layer 34, an insulation layer 35, and a wiring layer 36, which are sequentially stacked. The wiring substrate 10 is manufactured using a conventional build-up technique. Here, the wiring substrate 10 is a coreless wiring substrate, which does not include a core substrate that serves as a support substrate. Thus, the wiring substrate 10 differs from a wiring substrate including a core substrate and a required number of build-up layers stacked on at least one of both surfaces of the core substrate.

For example, copper (Cu) or a copper alloy may be used as a material of the wiring layers 30, 32, 34, and 36. For example, insulative resin such as epoxy resin or polyimide resin may be used as a material of the insulation layers 31, 33, and 35. Alternatively, a resin material in which a filler such as silica ($SiO_2$) or alumina ($Al_2O_3$) is mixed with insulative resin may be used as the material of the insulation layers 31, 33, and 35. Further, for example, thermosetting insulative resin or photosensitive insulative resin may be used as the material of the insulation layers 31, 33, and 35. Furthermore, for example, insulative resin including a reinforcement material, in which a reinforcement material is impregnated with thermosetting insulative resin, may be used as the material of the insulation layers 31, 33, and 35. A woven fabric or a non-woven fabric using a fiber bundle such as a glass, aramid, or a liquid crystal polymer (LCP) may be used as the reinforcement material. Epoxy resin or polyimide resin may be used as thermosetting insulative resin.

The wiring layer 30 is the outermost wiring layer (the lowermost wiring layer in FIG. 2A) and includes a first surface 30A (lower surface in FIG. 2A). The insulation layer 31 is the outermost insulation layer (the lowermost insulation layer in FIG. 2A) and includes a first surface 31A (lower surface in FIG. 2A). The first surface 30A of the wiring layer 30 is exposed from the first surface 31A of the insulation layer 31 and formed to be substantially flush with the first surface 31A. For example, the wiring layer 30 is formed as connection pads P1 used for electric connection with electronic components such as a semiconductor chip 60 (see FIG. 4). In other words, the surface on which the connection pads P1 (the wiring layer 30) is formed in the wiring substrate 12, that is, the lower surface of the wiring substrate 12 in FIG. 2A functions as a chip mounting surface. For example, the wiring layer 30 may have a thickness of about 3 μm to 20 μm.

The wiring layer 30 includes a second surface 30B (upper surface in FIG. 2A) and a side surface which are covered with the insulation layer 31. The insulation layer 31 includes a second surface 31B (upper surface in FIG. 2A). A plurality of via holes 31X extends through the insulation layer 31 from the second surface 31B in the thickness direction and partially exposes the second surface 30B of the wiring layer 30. A plurality of through holes 31Y extends through the insulation layer 31 from the first surface 31A to the second surface 31B. The through holes 31Y are concentrated in a specific region in the wiring substrate 12, that is, a region in which the identification mark 15 is formed. Further, a plurality of through holes 31Z extends through the insulation layer 31 from the first surface 31A to the second surface 31B at the position of the outer frame 20. The through holes 31Z are concentrated in a specific region of the outer frame 20, that is, a region in which the identification mark 25 is formed. For example, the thickness of the second surface 30B of the wiring layer 30 to the second surface 31B of the insulation layer 31 may be set to about 15 μm to 45 μm.

In FIG. 2A, the via holes 31X and the through holes 31Y and 31Z are each formed in a tapered shape whose diameter increases from the lower side (first surface 31A) toward the upper side (second surface 31B). For example, the via holes 31X and the through holes 31Y and 31Z are each formed substantially in an inverted truncated cone shape having an opening diameter in which an upper side opening is larger than a lower side opening.

A via wiring 41 that electrically connects the wiring layer 30 with the wiring layer 32 is formed in each of the via holes 31X. In other words, the via hole 31X is filled with the via wiring 41. Thus, the via wiring 41 has the same shape as the via hole 31X. For example, copper or a copper alloy may be used as a material of the via wiring 41.

A via wiring 42 is formed in each of the through holes 31Y. In other words, the through hole 31Y is filled with the via wiring 42. Similarly to the through hole 31Y, the via wiring 42 is formed in a tapered shape whose diameter increases from the lower side (first surface 31A) toward the upper side (second surface 31B) in FIG. 2A. For example, the via wiring 42 is formed substantially in an inverted truncated cone shape in which the first surface 42A (lower surface in FIG. 2A) is smaller in a diameter than the second surface (upper surface in FIG. 2A). The first surface 42A (lower surface) of the via wiring 42 is exposed from the first surface 31A (lower surface) of the insulation layer 31. For example, the first surface 42A of the via wiring 42 is formed to be substantially flush with the first surface 30A of the wiring layer 30. Further, for example, the first surface 42A of the via wiring 42 is formed to be substantially flush with the first surface 31A of the insulation layer 31 as well. For example, the diameter of the first surface 42A of the via wiring 42 may be set to about 30 μm to 120 μm. For example, copper or a copper alloy may be used as a material of the via wiring 42.

The plurality of via wirings 42 forms the identification mark 15. That is, the via wirings 42 are formed to define the identification mark 15 identifiable as a specific shape, which includes a character, a symbol, or a combination thereof, at a planar view.

Figure 3B:
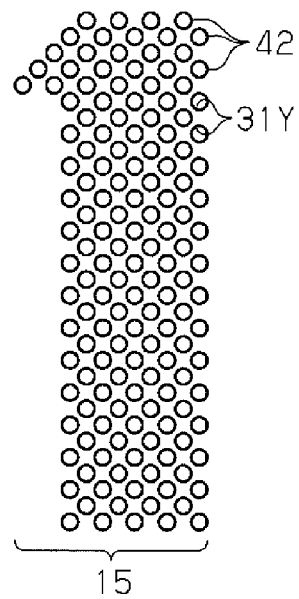

For example, as illustrated in FIGS. 3A and 3B, the via wirings 42 are identifiable as "1" (specific shape) when the wiring substrate 10 is viewed from the lower side (that is, the lower surface side of the insulation layer 31) in FIG. 2A. Each of the via wiring 42 is a fine wire having a diameter of about 40 μm to 50 μm. Thus, in order to cause the via wirings 42 to be identifiable as a specific shape, it is necessary to concentrate the via wirings 42. As illustrated in FIG. 3A, the via wirings 42 may come into contact with one another at a planar view, or may overlap one another at a planar view. Alternatively, as illustrated in FIG. 3B, some of the via wirings 42 may be thinned out in a range in which the identification mark 15 is identifiable as a specific shape so that the via wirings 42 do not overlap at a planar view.

As illustrated in FIG. 2A, a via wiring 43 is formed in each of the through holes 31Z. In other words, the through hole 31Z is filled with the via wiring 43. Similarly to the through hole 31Z, the via wiring 43 is formed in a tapered shape whose diameter increases from the lower side (first surface 31A) toward the upper side (second surface 31B) in FIG. 2A. For example, the via wiring 43 is formed substantially in an inverted truncated cone shape in which a first surface 43A (lower surface in FIG. 2A) is smaller in a diameter than an opposite second surface (upper surface in FIG. 2A). The first surface 43A of the via wiring 43 is exposed from the first surface 31A (lower surface) of the insulation layer 31. For example, the first surface 43A of the via wiring 43 is formed to be substantially flush with the first surface 30A of the wiring layer 30 and the first surface 42A of the via wiring 42. Further, for example, the first surface 43A of the via wiring 43 is formed to be substantially flush with the first surface 31A of the insulation layer 31. For example, the diameter of the first surface 43A of the via wiring 43 may be set to about 40 μm to 50 μm. For example, copper or a copper alloy may be used as the material of the via wiring 43.

Similarly, the plurality of via wirings 43 forms the identification mark 25. In other words, the via wirings 43 are formed to define the identification mark 15 identifiable as a specific shape, which includes a character, a symbol, or a combination thereof, at a planar view.

Figure 3C:
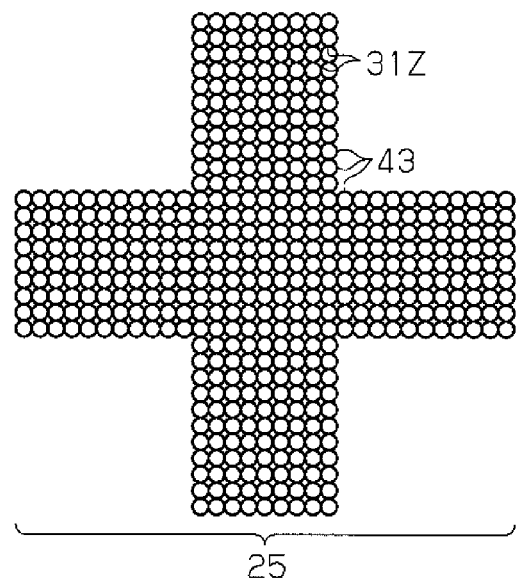

For example, as illustrated in FIG. 3C, the via wirings 43 are identifiable as "+" (specific shape) when the wiring substrate 10 is viewed from the lower side (that is, the lower surface side of the insulation layer 31) in FIG. 2A. Each of the via wirings 43 is a fine wire having a diameter of about 40 μm to 50 μm. Thus, in order to cause the via wirings 43 to be identifiable as a specific shape, it is necessary to concentrate the via wirings 43. Similarly to the via wirings 42, the via wirings 43 may come into contact with one another or may overlap one another at a planar view. Alternatively, some of the via wirings 43 may be thinned out in a range in which the identification mark 25 is identifiable as a specific shape so that the via wirings 43 do not overlap at a planar view.

Figure 3D:
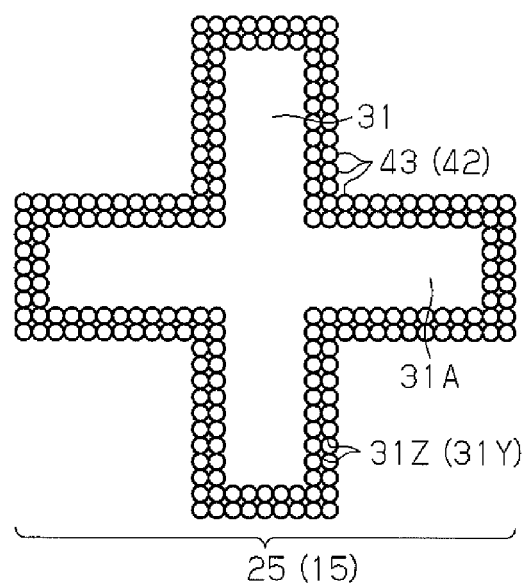

In the examples illustrated in FIGS. 3A to 3C, a specific shape (here, "1" or "+") is formed by concentrating the via wirings 42 or via wirings 43. Instead, as illustrated in FIG. 3D, for example, the via wirings 43 may be arranged to surround a contour of a specific shape (here, "+"). In this case, a planar shape of the first surface 31A of the insulation layer 31 surrounded by the via wirings 43 is identifiable as a specific shape ("+"). Further, although not illustrated, the via wirings 43 may be formed in a region of the outer frame 20 other than in the region in which the identification mark 25 identifiable as a specific shape (e.g., "+") is formed. Also in this case, a planar shape of the first surface 31A of the insulation layer 31 is identifiable as a specific shape ("+") in the region in which the identification mark 25 having no via wirings 43 is formed. In both cases, the via wirings 43 define the identification mark 25 identifiable as a specific shape (here, "+"). Although the detailed description is omitted, the same applies to the via wiring 42 with regard to the identification mark 15.

As illustrated in FIG. 2A, the identification mark 15 (i.e., the via wirings 42) is formed on the chip mounting surface of the wiring substrate 12, and the identification mark 25 (i.e., the via wirings 43) is formed on the surface of the outer frame 20 that is at the same level as the chip mounting surface.

The wiring layer 32 is stacked on the second surface 31B of the insulation layer 31. In the wiring substrate 12, the wiring layer 32 includes a plurality of wiring patterns, each of the wiring patterns being connected to the via wirings 41, the via wirings 42, or the via wirings 41 and 42. For example, each of the wiring patterns of the wiring layer 32 in the wiring substrate 12 is formed to be integrated with the via wirings 41, the via wirings 42, or the via wirings 41 and 42. The wiring pattern connected to the via wirings 41 is electrically connected to the wiring layer 30. The wiring pattern connected to the via wirings 42 is formed in a solid shape (i.e., a flat plane shape) so as to be commonly connected to the via wirings 42. In the outer frame 20, the wiring layer 32 includes a plurality of wiring patterns, each of the wiring patterns being connected to the via wirings 43. For example, each of the wiring patterns of the wiring layer 32 in the outer frame 20 is formed to be integrated with the via wirings 43. The wiring pattern connected to the via wirings 43 is formed in a solid shape to be commonly connected to the via wirings 43. For example, the thickness of the wiring layer 32 may be set to about 10 μm to 20 μm.

The insulation layer 33 is stacked on the second surface 31B of the insulation layer 31 to cover the wiring layer 32. Via holes 33X extend through the insulation layer 33 in the thickness direction at given positions of the insulation layer 33 to partially expose the surface (upper surface in FIG. 2A) of the wiring layer 32. For example, the thickness of the insulation layer 33 on the wiring layer 32 may be set to about 15 μm to 35 μm.

The wiring layer 34 is stacked on the surface (upper surface in FIG. 2A) of the insulation layer 33. The wiring layer 34 is electrically connected to the wiring layer 32 by via wirings filling the via holes 33X. For example, the wiring layer 34 is formed to be integrated with the via wirings filling the via holes 33X. For example, the thickness of the wiring layer 34 may be set to about 10 μm to 20 μm.

The insulation layer 35 is stacked on the upper surface of the insulation layer 33 to cover the wiring layer 34. Via holes 35X extend through the insulation layer 35 in the thickness direction at given positions of the insulation layer 35 to partially expose the surface (upper surface in FIG. 2A) of the wiring layer 34. For example, the thickness of the insulation layer 35 on the wiring layer 34 may be set to about 15 μm to 35 μm.

The wiring layer 36 is the outermost wiring layer (the uppermost wiring layer in FIG. 2A) stacked on the surface (upper surface in FIG. 2A) of the insulation layer 35. The wiring layer 36 electrically connected to the wiring layer 34 by the via wirings filling the via holes 35X. For example, the wiring layer 36 is formed to be integrated with the via wirings filling the via holes 35X. For example, the thickness of the wiring layer 36 may be set to about 10 μm to 20 μm.

The via holes 33X and 35X are each formed in a tapered shape whose diameter increases from the lower side (the wiring layer 30 side) toward the upper side (the wiring layer 36 side) in FIG. 2A. For example, the via holes 33X and 35X are each formed substantially in an inverted truncated cone shape having an opening diameter in which an upper side opening is larger than a lower side opening.

In this manner, in the wiring substrate 10, the via holes 31X, 33X, and 35X and the through holes 31Y and 31Z are each formed in the tapered shape having the opening diameter in which one opening (the lower side opening in FIG. 2A) is smaller than the other opening (the upper side opening in FIG. 2A).

The insulation layer 35 is the outermost insulation layer (the uppermost insulation layer in FIG. 2A). A solder resist layer 37 is stacked on the surface (upper surface in FIG. 2A) of the insulation layer 35. The solder resist layer 37 includes openings 37X that partially expose the surface (upper surface in FIG. 2A) of the uppermost wiring layer 36 as external connection pads P2. The external connection pads P2 are used for connection with external connection terminals. The external connection terminal is a solder ball, a lead pin, or the like which is used when the wiring substrate 12 is mounted on a mounting substrate such as a mother board. In other words, the surface on which the external connection pads P2 are formed in the wiring substrate 12, that is, the upper surface of the wiring substrate 12 in FIG. 2A functions as an external connection terminal surface. An organic solderability preservative (OSP) process may be performed on the wiring layer 36 exposed from the openings 37X so that an OSP film is formed on the wiring layer 36 as necessary. In this case, the external connection terminals are connected to the OSP film. Further, a metallic layer may be formed on the wiring layer 36 exposed from the openings 37X. In this case, the external connection terminals are connected to the metallic layer. Examples of the metallic layer include a layer of gold (Au), a layer of nickel (Ni)/Au (a metallic layer in which an Ni layer and an Au layer are sequentially stacked on the wiring layer 36), and a layer of Ni/palladium (Pd)/Au (a metallic layer in which an Ni layer, a Pd layer, and an Au layer are sequentially stacked on the wiring layer 36). For example, an electroless plating metallic layer may be used as the layer of Ni, the layer of Au, and the layer of Pd. The layer of Au is a metallic layer made of Au or an Au alloy, the layer of Ni is a metallic layer made of Ni or a Ni alloy, and the layer of Pd is a metallic layer made of Pd or a Pd alloy. Further, the wiring layer 36 exposed from the openings 37X may be used as the external connection terminals. Alternatively, when the OSP film or the metallic layer is formed on the wiring layer 36, the OSP film or the metallic layer may be used as the external connection terminals.

For example, the external connection pads P2 and the openings 37X are arranged in the form of a matrix at a planar view. The external connection pads P2 and the openings 37X may each have an arbitrary planar shape and an arbitrary size. For example, the external connection pads P2 and the openings 37X may each have a circular shape having a diameter of about 200 μm to 300 μm. For example, insulative resin such as epoxy resin or acrylic resin may be used as a material of the solder resist layer 37. The solder resist layer 37 may include a filler such as silica or alumina.

FIG. 2B illustrates one of the wiring substrates 12A fragmentized by cutting the insulation layers 31, 33, and 35 and the solder resist layer 37 at the cutting positions A1 illustrated in FIG. 2A. A solder resist layer 38 is stacked on the first surface 31A of the insulation layer 31 of the wiring substrate 12A. The solder resist layer 38 covers the first surfaces 42A of the via wirings 42 that form the identification mark 15. The solder resist layer 38 includes openings 38X that partially expose the first surface 30A of the lowermost wiring layer 30 as the connection pads P1. Bumps 61 of the semiconductor chip 60 (see FIG. 4) are flip-chip-joined with the connection pads P1. An OSP film or a metallic layer may be formed on the wiring layer 30 exposed from the openings 38X as necessary. Examples of the metallic layer include a layer of Au, a layer of Ni/Au, and a layer of Ni/Pd/Au.

The connection pads P1 and the openings 38X are arranged in the form of a matrix at a planar view. The connection pads P1 and the openings 38X are positioned in a chip mounting region in which the semiconductor chip 60 is mounted. The connection pads P1 and the openings 38X may each have an arbitrary planar shape and an arbitrary size. For example, the connection pads P1 and the openings 38X may each have a circular shape having a diameter of about 40 μm to 200 μm.

Here, for example, transparent or semi-transparent light yellow is preferably used as a color of the solder resist layer 38. For example, a resin material in which a given light yellow-based pigment is contained in insulative resin such as epoxy resin or acrylic resin may be used as the material of the solder resist layer 38. When it is possible to implement transparent or semi-transparent light yellow by an external appearance color tone of the insulative resin, a light yellow-based pigment need not be necessarily used. Further, the solder resist layer 38 may include a filer such as silica or alumina.

For example, the solder resist layer 38 preferably has characteristics in which permeability of a long wavelength side is higher than permeability of a short wavelength side. The solder resist layer 38 having such characteristics may effectively transmit a color (a wavelength of about 600 nm to 800 nm) of copper that is used as the material of the via wiring 42. Thus, even when the openings that expose the via wirings 42 are not formed in the solder resist layer 38, it is possible to visually recognize the identification mark 15 from the lower portion side of the solder resist layer 38.

Figure 4:
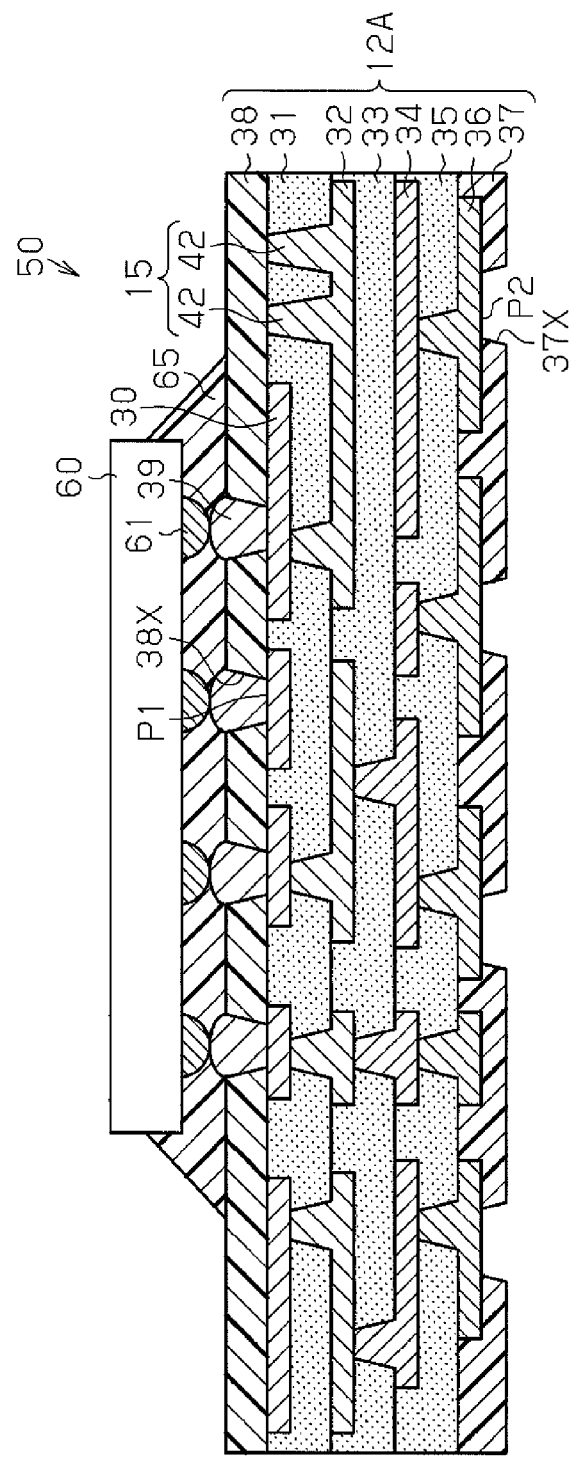
FIG. 4 is a schematic cross-sectional view illustrating one embodiment of a semiconductor device including the unit wiring substrate of FIG. 2B.

Next, the structure of a semiconductor device 50 including the wiring substrate 12 will now be described with reference to FIG. 4. FIG. 4 illustrates a state in which the wiring substrate 12A illustrated in FIG. 2B is upside down.

The semiconductor device 50 includes the wiring substrate 12A, the semiconductor chip 60 that is flip-chip-mounted on the wiring substrate 12A, and an underfill resin 65. Solder 39 is formed on each of the connection pads P1 of the wiring substrate 12A. For example, eutectic solder or lead (Pb)-free solder (a tin (Sn)-silver (Ag) type, an Sn—Cu type, an Sn—Ag—Cu type, or the like) may be used as the solder 39.

For example, a logic chip such as a central processing unit (CPU) or a graphics processing unit (GPU) may be sued as the semiconductor chip 60. Further, for example, a memory chip such as a dynamic random access memory (DRAM) chip, a static random access memory (SRAM) chip, or a flash memory chip may be used as the semiconductor chip 60. For example, a plurality of semiconductor chips 60 such as a logic chip and a memory chip may be mounted on the wiring substrate 12A.

For example, the size of the semiconductor chip 60 may be set to about 3 mm×3 mm to 12 mm×12 mm at a planar view. Further, for example, the thickness of the semiconductor chip 60 may be set to about 50 µm to 100 µm.

For example, a gold bump or a solder bump may be used as the bump 61. For example, an alloy including lead, an alloy of Sn and Au, an alloy of Sn and Cu, an alloy of Sn and Ag, an alloy of Sn, Ag, and Cu, or the like may be used as a material of the solder bump.

The underfill resin 65 fills a gap between the wiring substrate 12A and the semiconductor chip 60. For example, insulative resin such as epoxy based resin may be used as the material of the underfill resin 65.

Next, a method of manufacturing the wiring substrate 10 will now be described. To help with understanding, the manufacturing method will now be described using reference numerals corresponding to the final elements of the wiring substrate 10.

Figure 5A:
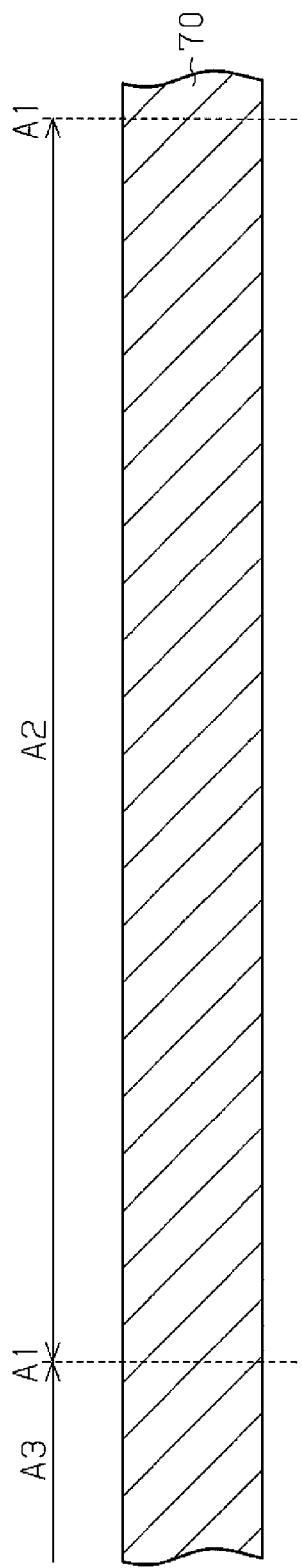

In the step illustrated in FIG. 5A, a support 70 serving as a provisional substrate is prepared. The support 70 includes a substrate forming region A2 for forming a wiring substrate 12 (see FIG. 2A). FIG. 5A illustrates one substrate forming region A2, but a plurality of substrate forming regions A2 is formed in the support 70. The support 70 further includes an outer frame forming region A3 for forming an outer frame 20 (see FIG. 2A) outside the plurality of substrate forming regions A2. For example, a metallic plate or a metallic foil may be used as the support 70. In this example, a copper foil may be used as the support 70. For example, the thickness of the support 70 may be set to about 3 µm to 100 µm.

Figure 5B:
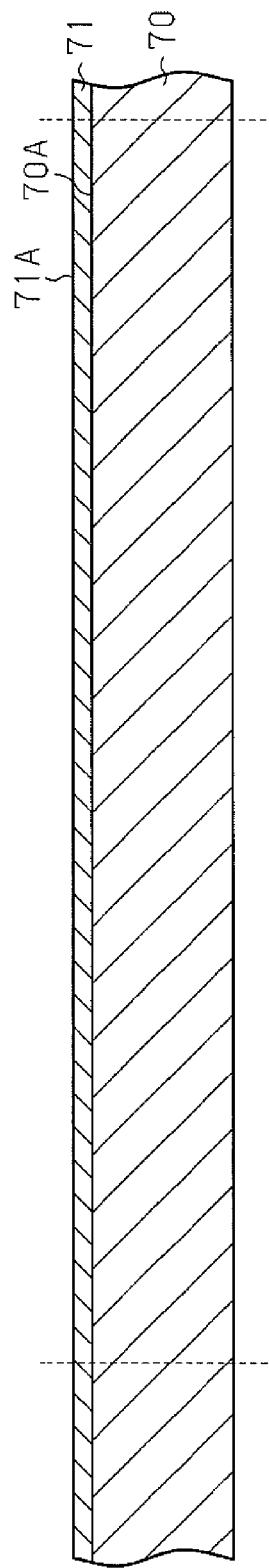

Next, in the step illustrated in FIG. 5B, a metallic film 71 is formed on an upper surface 70A of the support 70. For example, an upper surface 71A of the metallic film 71 is planarized. For example, the metallic film 71 may be formed using an electroplating technique, a sputtering technique, or a deposition technique. For example, a conductive material that allows selective etching of a wiring layer 30 and a via wiring 42 (for example, a layer of Cu) which will be formed in a subsequent step may be used as a material of the metallic film 71. For example, metal such as Ni, chromium (Cr), Sn, cobalt (Co), iron (Fe), or Pd or an alloy including at least one type of metal selected from the metal may be used as a material of the metallic film 71. In this example, Ni may be used as the material of the metallic film 71. For example, the thickness of the metallic film 71 may be set to about 0.1 µm to 1.0 µm. In this example, the metallic film 71 functions as a support together with the support 70.

Figure 6A:
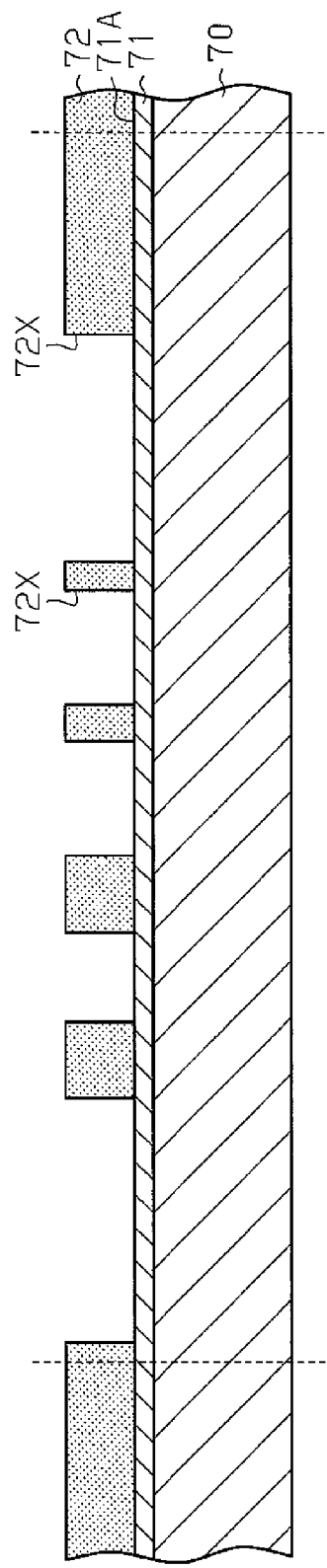

Next, in the step illustrated in FIG. 6A, a resist layer 72 including a plurality of opening patterns 72X is formed in the upper surface 71A of the metallic film 71. The opening pattern 72X exposes the metallic film 71 at the position corresponding to the region in which the wiring layer 30 (see FIG. 2A) is formed. For example, a material having plating resistance against a subsequent plating process may be used as a material of the resist layer 72. For example, a photosensitive dry film resist or a liquid photoresist may be used as the resist layer 72. For example, novolac-based resin, acrylic-based resin, or the like may be used as the material of the resist layer 72. For example, when a photosensitive dry film resist is used, a dry film resist is stacked on the upper surface 71A of the metallic film 71 and undergoes thermocompression bonding, and the resist layer 72 is formed by patterning the dry film resist using a photolithography technique. Further, when a liquid photoresist is used, the resist layer 72 may be formed through a similar process.

Figure 6B:
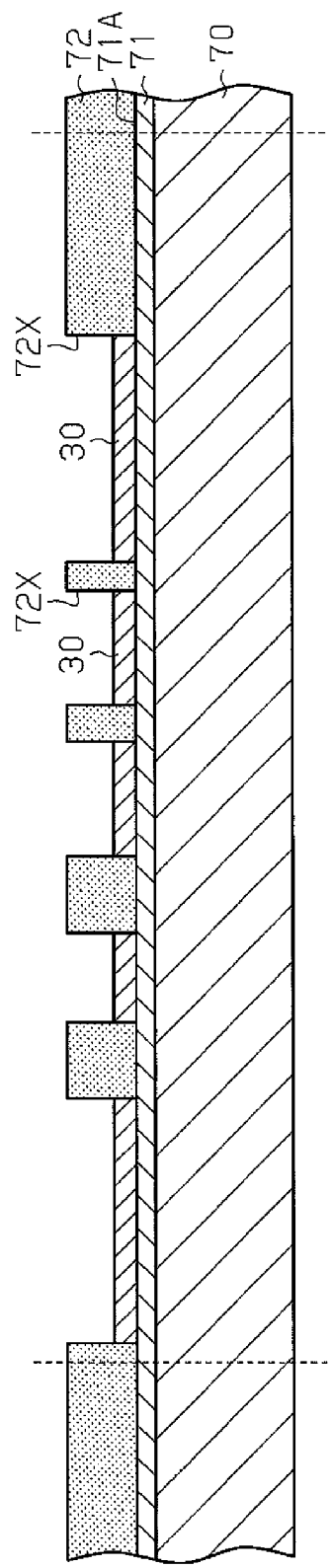

Next, in the step illustrated in FIG. 6B, the wiring layer 30 is formed on the metallic film 71 exposed from the opening pattern 72X of the resist layer 72. For example, electrolytic plating is performed on the upper surface 71A of the metallic film 71 using the resist layer 72 and the metallic film 71 as the plating mask and the plating power supplying layer. For example, the wiring layer 30 (the electrolytic plating metallic layer) is formed on the metallic film 71 by performing electrolytic copper plating on the upper surface 71A of the metallic film 71.

Next, in the step illustrated in FIG. 7A, the resist layer 72 illustrated in FIG. 6B is removed, for example, using an alkaline dissociation solution.

Next, in the step illustrated in FIG. 7B, an insulation layer 31 covering the entire upper surface 71A of the metallic film 71 and the wiring layer 30 is formed. For example, the insulation layer 31 is formed on the upper surface 71A of the metallic film 71 positioned in the substrate forming region A2 and the outer frame forming region A3. A resin film may be used on the insulation layer 31. In this case, for example, the insulation layer 31 may be formed by stacking the resin film on the metallic film 71 and curing the resin film by a heat treatment at a temperature of about 130° C. to 190° C. while pressurizing the resin film. At this time, it is possible to suppress the occurrence of a void in the insulation layer 31 by stacking the resin film in a vacuum atmosphere. Alternatively, liquid insulative resin or paste-like insulative resin may be used as the insulation layer 31. In this case, the insulation layer 31 may be formed such that the metallic film 71 is coated with the liquid insulative resin or the paste-like insulative resin using a spin coating technique or the like, and the insulative resin is cured by a thermal treatment at a temperature of about 130° C. to 190° C.

Figure 8A:
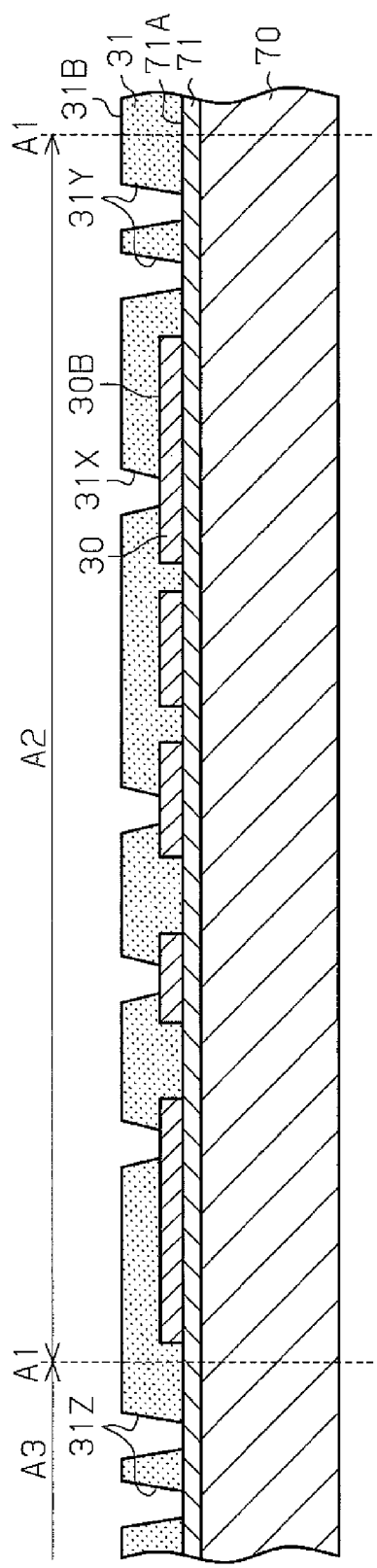

Next, in the step illustrated in FIG. 8A, via holes 31X and through holes 31Y and 31Z are formed in the insulation layer 31. The via holes 31X partially expose the second surface 30B of the wiring layer 30. The through holes 31Y expose the upper surface 71A of the metallic film 71 at certain positions of the substrate forming region A2. The through holes 31Z expose the upper surface 71A of the metallic film 71 at given positions of the outer frame forming region A3. The via holes 31X and the through holes 31Y and 31Z may be formed by a laser processing, for example, using a $CO_2$ laser, a YAG laser, or the like. When the insulation layer 31 is formed using a photosensitive resin, the necessary via holes 31X and the through holes 31Y and 31Z may be formed by performing the photolithography.

Then, when the via holes 31X and the through holes 31Y and 31Z are formed by the laser processing, a desmear process is performed to remove a resin smear (resin residue) fixed onto the exposed surfaces of the wiring layer 30 and the metallic film 71 exposed through the via holes 31X and the through holes 31Y and 31Z.

Figure 8B:
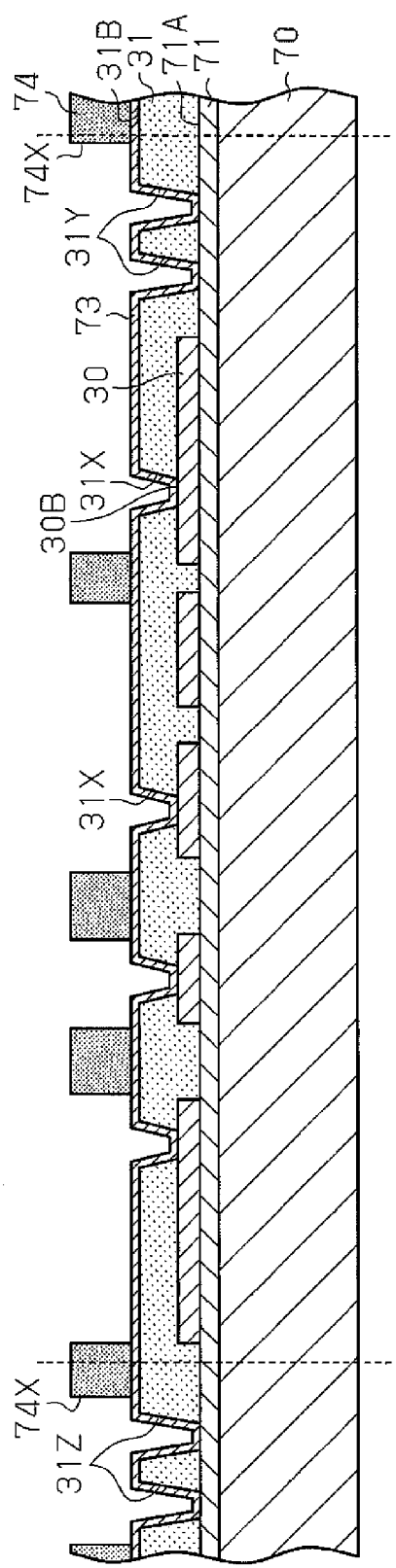

Next, in the step illustrated in FIG. 8B, a seed layer 73 is formed. The seed layer 73 consecutively covers the entire surface of the insulation layer 31 including inner walls of the via holes 31X and the through holes 31Y and 31Z, the entire surfaces (exposed surfaces) of the second surface 30B of the wiring layer 30 exposed through the via holes 31X, and the entire surfaces (exposed surfaces) of the upper surface 71A of the metallic film 71 exposed through the through holes 31Y and 31Z. For example, the seed layer 73 may be formed using a sputtering technique or an electroless plating technique. For example, copper or a copper alloy may be used as a material of the seed layer 73. Further, the seed layer 73 may have the structure in which metallic films are stacked. For example, the seed layer 73 may have the structure in which a first metallic film made of a titanium nitride, a tantalum nitride (TaN), tantalum (Ta), chromium (Cr), or the like and a second metallic film made of copper or a copper alloy are stacked. The titanium nitride or the tantalum nitride is metal having corrosion resistance higher than copper, and higher in adhesion with insulation layer 31 than copper.

Before the seed layer 73 is formed, a plasma process such as $O_2$ plasma ashing may be performed on the surface of the insulation layer 31. The plasma process roughens the surface of the insulation layer 31. The rough surface of the insulation layer 31 improves adhesion between the seed layer 73 and the insulation layer 31.

Then, a resist layer 74 including opening patterns 74X is formed on the seed layer 73. The opening pattern 74X exposes the seed layer 73 at a position corresponding to a region in which the wiring layer 32 (see FIG. 2A) is formed. For example, a material having plating resistance against a subsequent plating process may be used as a material of the resist layer 74. For example, the same material as the material of the resist layer 72 illustrated in FIG. 6A may be used for the resist layer 74. Further, the resist layer 74 may be formed by the same method as that of the resist layer 72.

Next, in the step illustrated in FIG. 9A, electrolytic plating is performed on the upper surface of the seed layer 73 using the resist layer 74 and the seed layer 73 as the plating mask and the plating power supplying layer. For example, by performing electrolytic copper plating on the upper surface of the seed layer 73, a metallic layer 75 is formed on the seed layer 73 in the via hole 31X, a metallic layer 76 is formed on the seed layer 73 in the through hole 31Y, and a metallic layer 77 is formed on the seed layer 73 in the through hole 31Z. Further, a metallic layer 78 is formed on the upper surfaces of the metallic layers 75 to 77 and the upper surface of the seed layer 73 through electrolytic copper plating.

Next, in the step illustrated in FIG. 9B, the resist layer 74 illustrated in FIG. 9A is removed, for example, by alkaline dissociation solution. Then, the unnecessary seed layer 73 is removed by etching using the metallic layers 75 to 78 as an etching mask. As a result, each of the via holes 31X is filled with the via wiring 41 including the seed layer 73 and the metallic layer 75. Further, the wiring layer 32 including the seed layer 73 and the metallic layer 78 is arranged on the insulation layer 31. Further, each of the through holes 31Y is filled with the via wiring 42 including the seed layer 73 and the metallic layer 76, and each of the through holes 31Z is filled with the via wiring 43 including the seed layer 73 and the metallic layer 77. The via wirings 42 are arranged to define the identification mark 15 that is identifiable as a specific shape, which includes a character, a symbol, or a combination thereof, at a planar view. For example, the identification mark 15 is formed so that the entire image of the via wirings 42 is identified as "1" (a specific shape) at a planar view, as illustrated in FIGS. 3A and 3B. As described above, the fine via wirings 42 are concentrated and arranged so that the identification mark 15 has a specific shape. Similarly, the via wirings 43 are arranged to define the identification mark 25 identifiable as a specific shape at a planar view. For example, the identification mark 25 is formed so that the entire image of the via wirings 43 is identified as "+" (a specific shape) at a planar view, as illustrated in FIG. 3C. As described above, the fine via wirings 43 are concentrated and arranged so that the identification mark 25 has a specific shape.

In the manufacturing method described above, in the pattering (exposure) process of the resist layer 72 (see FIG. 6A) and the resist layer 74 (see FIG. 8B), for example, a step-and-repeat exposure method (an exposure method using a stepper) of exposing a plurality of regions divided in the large-sized support 70 to light one by one is used. In this exposure method, as illustrated in FIGS. 10A and 10B, the support 70 is divided into a plurality of regions A4, for example, a region A4 indicated by a thick line frame in FIG. 10A, a region A4 indicated by a thick line frame in FIG. 10B, and a remaining region A4. Then, the three regions A4 are sequentially subjected to light exposure one by one. That is, the region A4 indicated by the thick line frame in FIG. 10A is subjected to light exposure, the region A4 indicated by the thick line frame in FIG. 10B is then subjected to light exposure, and the remaining region A4 is lastly subjected to light exposure. In this method, since light exposure is performed on the three regions A4 using the same exposure mask, the resist layers 72 and 74 are patterned in the, same way in each of the regions A4. In other words, in the exposure method using the stepper, the same opening patterns 72X and 74X, that is, the wiring layers 30 and 32 of the same pattern are formed in each of the regions A4. Therefore, in the exposure method using the stepper, it is difficult to form an identification mark having a different shape according to each substrate forming region A2. For the same reason, it is difficult to form an identification mark having a different shape according to each outer frame forming region A3 in each region A4. By using the different exposure mask according to each, substrate forming region A2, an identification mark having a different shape may be formed according to each substrate forming region A2. However, in this case, it is necessary to perform light exposure on each substrate forming region A2, and it is necessary to switch the exposure mask for each light exposure. Thus, the manufacturing cost of the wiring substrate 10 is likely to increase significantly.

On the other hand, in the present embodiment, the through holes 31Y and 31Z and the via wirings 42 and 43 are formed in the step different from the patterning of the resist layers 72 and 74. Here, the through holes 31Y and 31Z are formed in the same step as the step of forming the via holes 31X, and the via wirings 42 and 43 are formed in the same step as the step of forming the via wiring 41. Further, in the present embodiment, the through holes 31Y and 31Z are formed by the laser processing. Thus, the identification mark 15 having a different shape according to each substrate forming region A2 may be easily formed by the via wirings 42. Further, the identification mark 25 having a different shape according to each outer frame forming region A3 of each region A4 may be easily formed by the via wirings 43.

Although the manufacturing time (laser processing time) for forming the through holes 31Y and 31Z increases, the through holes 31Y and 31Z are formed by the same step as the step of forming the via holes 31X. Thus, the increase in the manufacturing time of the wiring substrate 10 may be suitably suppressed compared to when the different exposure mask is used according to each substrate forming region A2 and the different exposure mask is used according to each outer frame forming region A3 of each region A4. As a result, the increase in the manufacturing cost of the wiring substrate 10 for forming the identification marks 15 and 25 is suitably suppressed.

Next, in the step illustrated in FIG. 11A, similarly to the steps illustrated in FIGS. 7B and 8A, the insulation layer 33 including the via holes 33X that partially expose the wiring layer 32 is formed on the second surface 31B of the insulation layer 31. Then, similarly to the steps illustrated in FIGS. 8B to 9B, the via wirings are formed in the via holes 33X, for example, by using a semi-additive technique, and the wiring layer 34 electrically connected to the wiring layer 32 by the via wirings is formed on the insulation layer 33.

Next, in the step illustrated in FIG. 11B, similarly to the steps illustrated in FIGS. 7B and 8A, the insulation layer 35 including the via holes 35X that partially expose the wiring layer 34 is formed on the insulation layer 33. Then, similarly to the steps illustrated in FIGS. 8B to 9B, the via wirings are formed in the via holes 35X, for example, by using a semi-additive technique, and the wiring layer 36 electrically connected to the wiring layer 34 by the via wirings is formed on the insulation layer 35.

Figure 12:
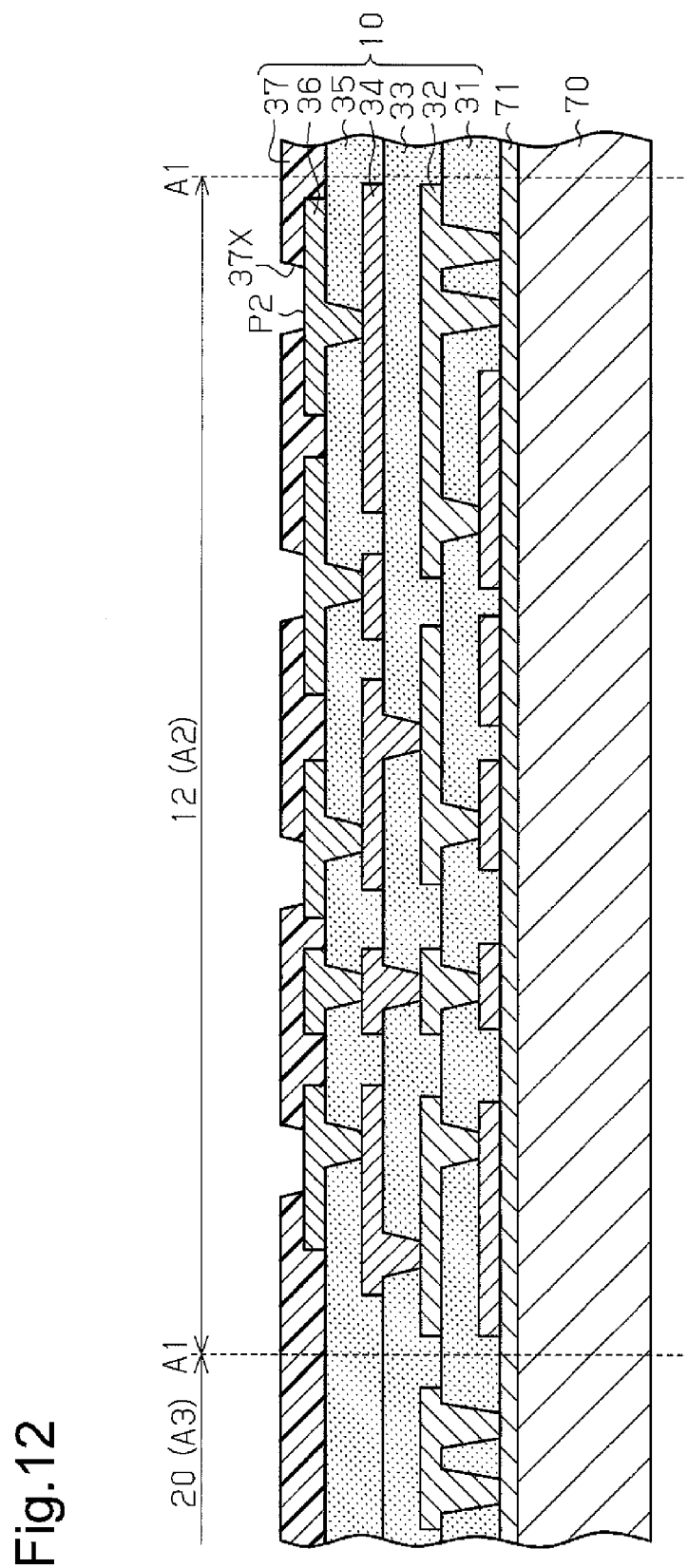

Next, in the step illustrated in FIG. 12, the solder resist layer 37 is formed on the insulation layer 35. The solder resist layer 37 includes the openings 37X that expose the external connection pads P2 at given positions of the wiring layer 36. For example, the solder resist layer 37 may be formed by stacking a photosensitive solder resist film and patterning the solder resist film into a given shape. As described above, the solder resist layer 37 may be formed using the liquid solder resist. For example, a metallic layer may be formed such that a layer of Ni and a layer of Au are sequentially stacked on each external connection pad P2 as necessary. Alternatively, an OSP film may be formed on each external connection pad P2. For example, the layer of Ni or the layer of Au may be formed by electroless plating.

By the manufacturing method described above, the wiring substrate 10 is manufactured on the supports 70 and 71. The wiring substrate 10 includes the wiring substrate 12 formed in each substrate forming region A2 and the outer frame 20 formed in each outer frame forming region A3.

Next, in the step illustrated in FIG. 13A, the support 70 (see FIG. 12) which is used as the provisional substrate is removed. For example, when the copper foil is used as the support 70, wet etching using a ferric chloride aqueous solution, a cupric chloride aqueous solution, an ammonium persulfate aqueous solution, or the like is performed to remove the support 70. In this case, the metallic film 71 (the layer of Ni) functions as an etching stopper layer. When the wiring layer 36 (the topmost layer) is a layer of Cu, in order to prevent the wiring layer 3 from being etched together with the support 70, it is necessary to perform wet etching while masking the wiring layer 36.

Next, the metallic film 71 is removed. For example, the metallic film 71 is etched using the wiring layer 30, the via wirings 42 and 43 (the layer of Cu), and the insulation layer 31 (the resin layer) as an etching stopper layer. In this case, for example, a nitric acid/hydrogen peroxide solution ($HNO_3$/$H_2O_2$) that is a mixture of a nitric acid and a hydrogen peroxide solution may be used as an etchant.

As illustrated in FIG. 13B, when the metallic film 71 is removed, the first surface 30A of the wiring layer 30, the first surfaces 42A of the via wirings 42, the first surfaces 43A of the via wirings 43, and the first surface 31A of the insulation layer 31 are exposed. At this time, the surfaces 30A, 42A, 43A, and 31A coming into contact with the upper surface 71A of the metallic film 71 before the metallic film is removed are formed in a shape according to the upper surface 71A (flat surface) of the metallic film 71. In other words, the shape of the upper surface 71A of the metallic film 71 is transferred onto the surfaces 30A, 42A, 43A, and 31A. Thus, the surfaces 30A, 42A, 43A, and 31A are substantially flush with one another.

By the manufacturing method described above, the wiring substrate 10 is manufactured.

Figure 14A:
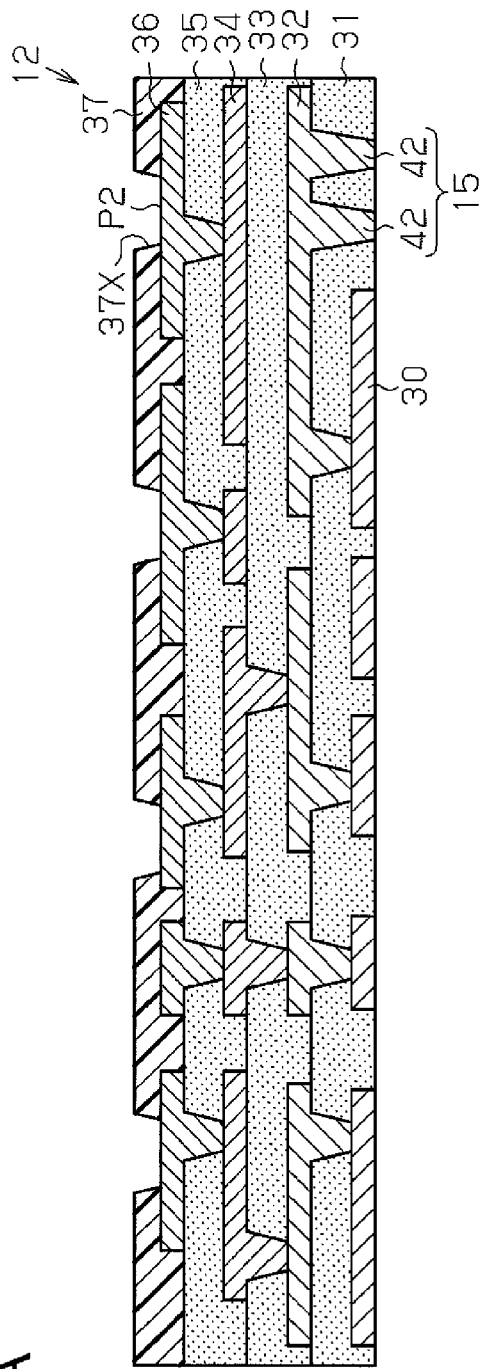

Next, the wiring substrate 10 illustrated in FIG. 13B is cut along the cutting positions A1 by a dicing blade or the like. As a result, as illustrated in FIG. 14A, the wiring substrate 10 is fragmentized into the wiring substrates 12. After the wiring substrate 10 is cut, the outer frame 20 is discarded.

Figure 14B:
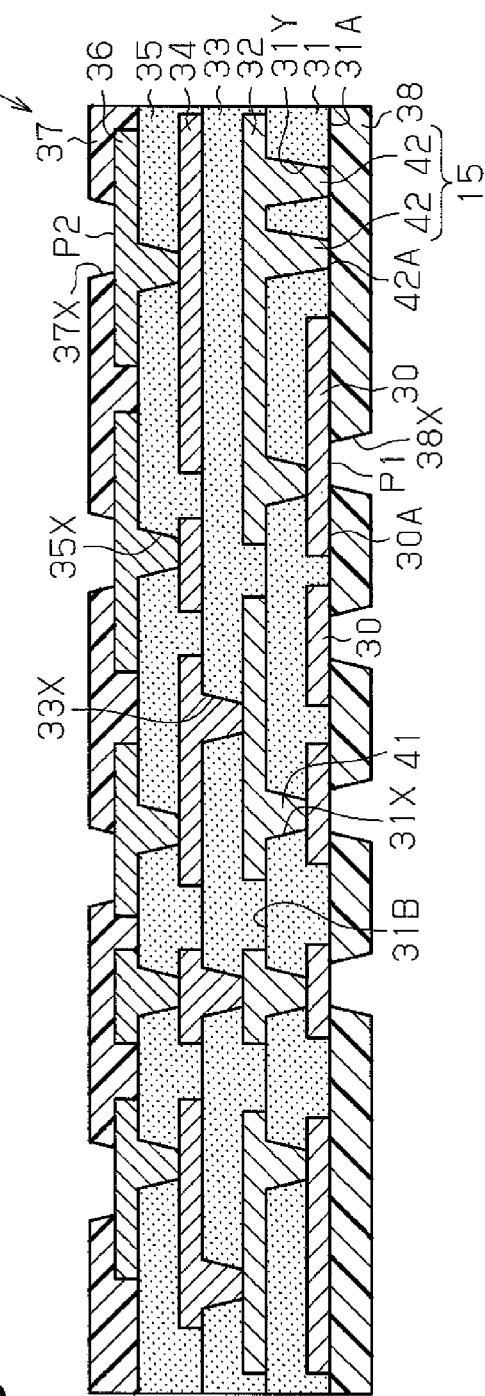

Next, in the step illustrated in FIG. 14B, a solder resist layer 38 is formed on the first surface 31A of the insulation layer 31. The solder resist layer 38 includes the openings 38X that expose the connection pads P1 at given positions of the wiring layer 30. For example, the solder resist layer 38 may be formed by stacking a photosensitive solder resist film and patterning the solder resist film into a given shape. As described above, the solder resist layer 38 may be formed using a liquid solder resist. For example, a metallic layer may be formed on each connection pad P1 such that a layer of Ni and a layer of Au are sequentially stacked as necessary. Alternatively, an OSP film may be formed on each connection pad P1. For example, the layer of Ni or the layer of Au may be formed by electroless plating.

By the manufacturing method described above, the wiring substrate 12A is manufactured.

Next, a method of manufacturing the semiconductor device 50 will now be described with reference to FIGS. 15A and 15B. FIGS. 15A and 15B illustrate a state in which the wiring substrate 12A illustrated in FIG. 14B is upside down.

In the step illustrated in FIG. 15A, solder 39 is formed on each of the connection pads P1 of the wiring substrate 12A. For example, the solder 39 may be formed by coating a soldering paste or mounting of a solder ball.

Next, in the step illustrated in FIG. 15B, the bumps 61 formed on a circuit forming surface (lower surface in FIG. 15B) of the semiconductor chip 60 are positioned on the connection pads P1. Then, the solder 39 is melted, and electrically connects the bump 61 with the connection pad P1. Consequently, the semiconductor chip 60 is flip-chip-mounted on the wiring substrate 12A.

Thereafter, the underfill resin 65 (see FIG. 4) is formed to fill a gap between the wiring substrate 12A and the semiconductor chip 60.

By the manufacturing method described above, the semiconductor device 50 illustrated in FIG. 4 is manufactured.

The present embodiment has the advantages described below.

(1) The via wirings 42 are formed in the through holes 31Y extending through the outermost insulation layer 31 in the thickness direction so as to define the identification mark 15 that is identifiable as a specific shape, which includes a character, a symbol, or a combination thereof, at a planar view. As the through holes 31Y are filled with the via wirings 42 (the layer of Cu), the visibility of the identification mark 15 formed by the via wirings 42 may be improved to be higher than that of the identification mark formed by the through holes in the related art.

(2) The first surfaces 42A of the via wirings 42 are formed to be substantially flush with the outermost first surface 30A of the wiring layer 30. Thus, the via wirings 42 (the layer of Cu) that form the identification mark 15 having a specific shape are arranged immediately below the solder resist layer 38. Accordingly, the visibility of the identification mark 15 formed by the via wirings 42 may be improved.

(3) In the step different from the step of forming the wiring layers 30 and 32 by patterning the resist layers 72 and 74, the through holes 31Y and 31Z are formed in the insulation layer 31. The through holes 31Y and 31Z are filled with the via wirings 42 and 43 that form the identification marks 15 and 25, respectively. Further, the through holes 31Y and 31Z are formed by the laser processing. Thus, the identification mark 15 having a different shape according to each substrate forming region A2 may be easily formed. Further, the identification mark 25 having a different shape according to each outer frame forming region A3 of each region A4 may be easily formed. In addition, the arrangement and the shape of the identification marks 15 and 25 may be freely selected. Thus, a degree of design freedom of the identification mark 15 to be arranged in each unit wiring substrate 12 may be improved. Further, a degree of design freedom of the identification mark 25 to be arranged in the outer frame 20 may be improved.

(4) In the same step as the step of forming the via holes 31X, the through holes 31Y and 31Z are formed by the laser processing. Thus, the increase in the manufacturing time of the wiring substrate 10 is suppressed. Accordingly, the increase in the manufacturing cost of the wiring substrate 10 is suppressed.

(5) In the related art in which the identification mark is formed by through holes, the solder resist layer that partially covers the uppermost wiring layer is formed and then through holes are formed to define the identification mark. Thus, if a metallic layer that covers the inner wall of each through hole or a metallic layer that fills each through hole is formed, it is necessary to perform the additional process for forming the metallic layer after the solder resist layer is formed.

In contrast, according to the manufacturing method of the present embodiment, in the same step as the step of forming the via wirings 41 and the wiring layer 32, the via wirings 42 and 43 are formed. Thus, the step of forming the via wirings 42 and 43 need not be performed in addition to the step of forming the via wirings 41 and the wiring layer 32. Further, it is unnecessary to perform the step of forming the via wirings 42 and 43 after the solder resist layer 38 is formed. As a result, the increase in the manufacturing time of the wiring substrate 10 is suitably suppressed. Accordingly, the increase in the manufacturing cost of the wiring substrate 10 is suppressed.

(6) The identification mark 15 is formed by the via wirings 42 filling the through holes 31Y. Further, transparent or semi-transparent light yellow is used as a color of the solder resist layer 38 covering the identification mark 15. Thus, the identification mark 15 may be visually recognized from the lower portion side of the solder resist layer 38 in FIG. 2B without forming an opening that expose the identification mark 15 in the solder resist layer 38.

It should be apparent to those skilled in the art that the present invention may be embodied in many other specific forms without departing from the spirit or scope of the invention. Particularly, it should be understood that the present invention may be embodied in the following forms.

Figure 16:
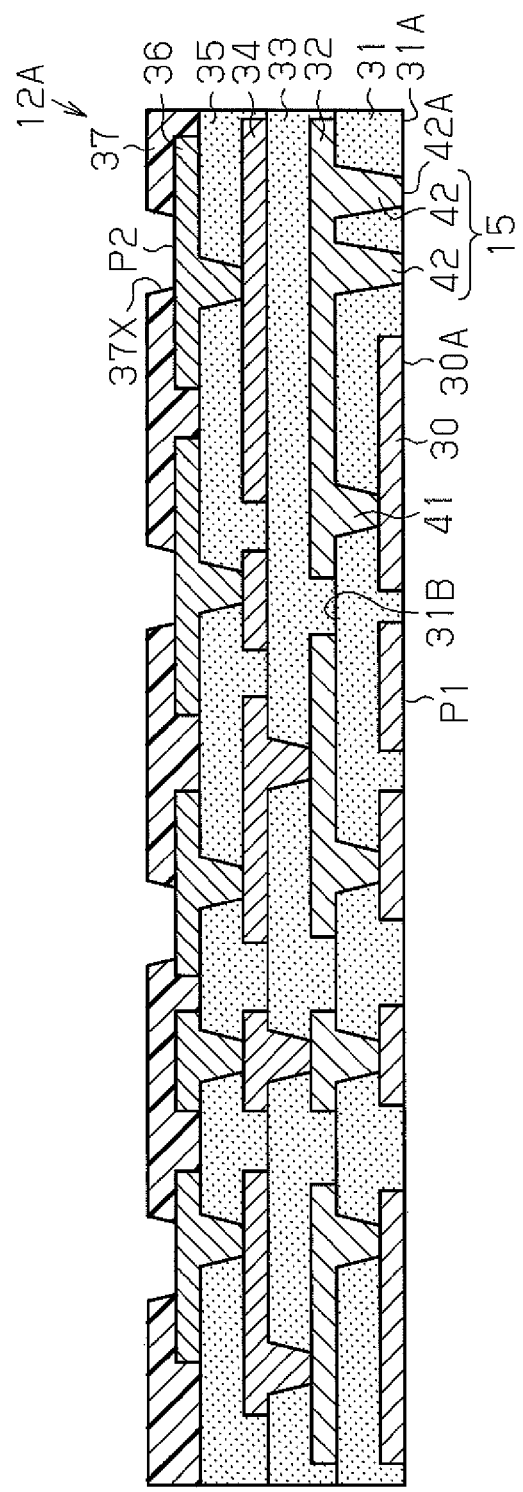
FIG. 16 is a schematic cross-sectional view illustrating a wiring substrate according to a modified example.

As illustrated in FIG. 16, the solder resist layer 38 (see FIG. 2B) may be omitted from the wiring substrate 12A. In other words, the first surfaces 42A of the via wirings 42 may be exposed directly to the outside.

In the embodiment and the modified example, the wiring layer 32 connected to the via wirings 42 is formed in a solid shape to be commonly connected to the via wirings 42. However, the shape of the wiring layer 32 connected to the via wirings 42 is not limited to a solid shape.

Figure 17A:
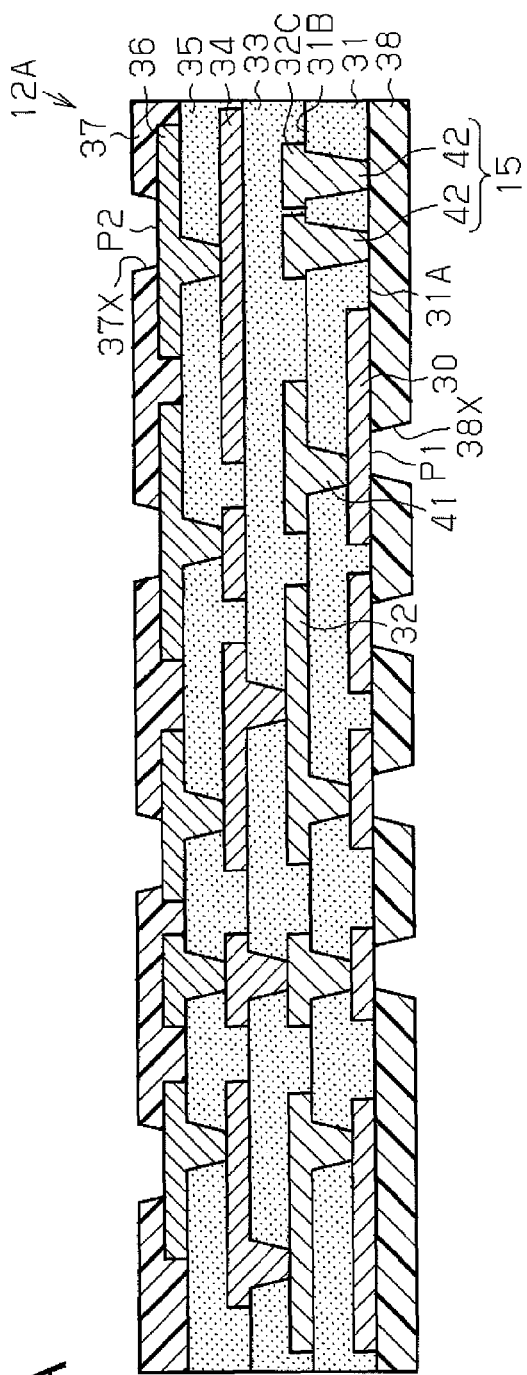
FIGS. 17A and 17B are schematic cross-sectional views illustrating a wiring substrate according to another modified example.
Figure 17B:
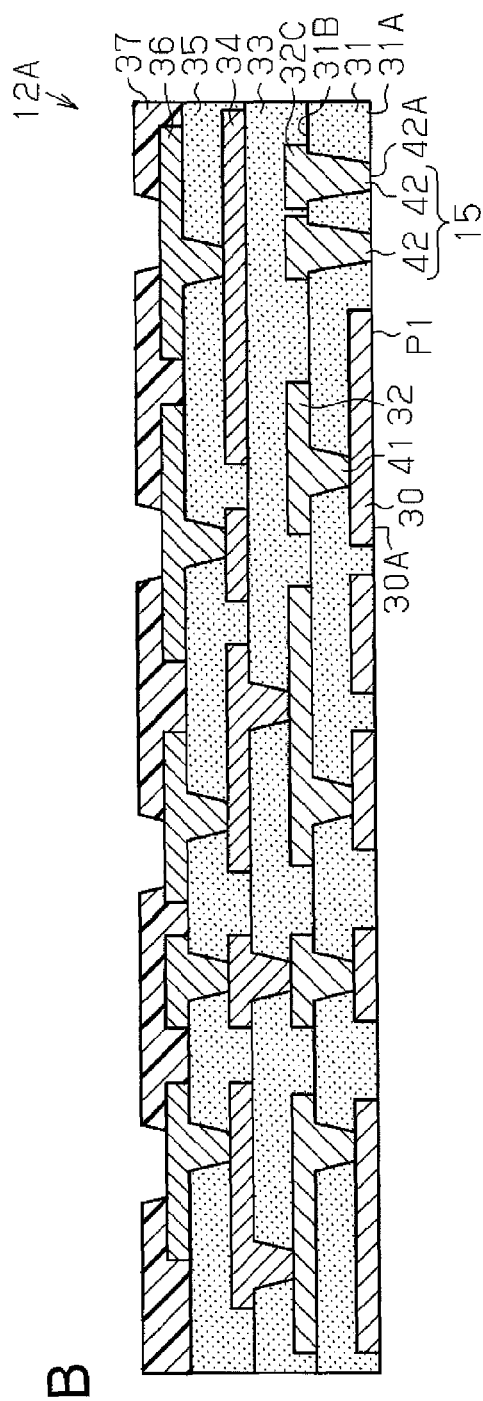
Figure 18:
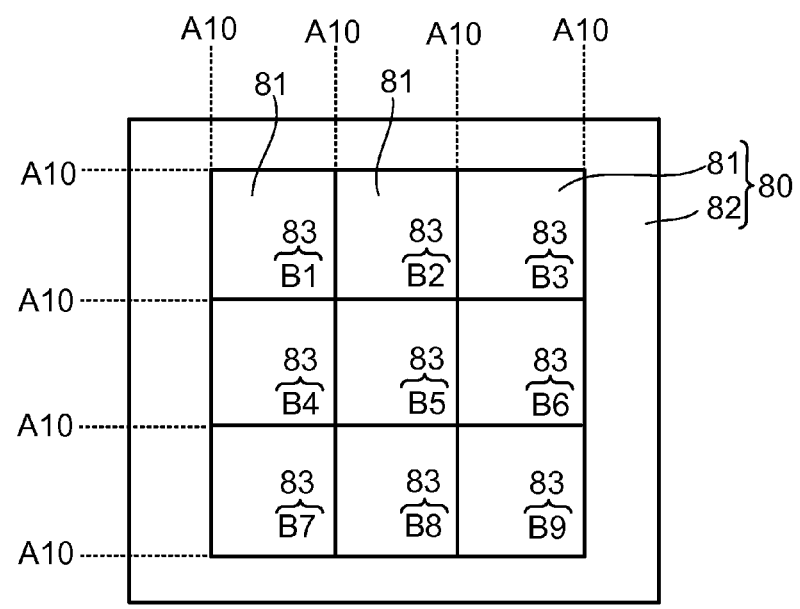
FIG. 18 is a schematic plan view illustrating a wiring substrate according to a related art.

For example, as illustrated in FIGS. 17A and 17B, wiring patterns 32C may be formed on the second surface 31B of the insulation layer 31 so that each of the wiring pattern 32C is connected to one of the via wirings 42. For example, each of the wiring patterns 32C may be formed to have a diameter larger than the second surface (upper surface in FIG. 17A) of the via wiring 42. In this case, the solder resist layer 38 may be formed on the first surface 31A of the insulation layer 31 as illustrated in FIG. 17A, and alternatively, the solder resist layer 38 may be omitted as illustrated in FIG. 17B.

In the above embodiment, the wiring layer 32 connected to the via wiring 43 is formed in a solid shape to be commonly connected to the via wirings 43. However, the shape of the wiring layer 32 connected to the via wirings 43 is not limited to a solid shape. For example, similarly to the wiring pattern 32C illustrated in FIGS. 17A and 17B, wiring patterns may be formed on the second surface 31B of the insulation layer 31 so that each of the wiring patterns is connected to one of the via wirings 43.

In the above embodiment, the identification mark 15 formed by the via wirings 42 is formed in the wiring substrate 12, and the identification mark 25 formed by the via wirings 43 is formed in the outer frame 20. Instead, for example, the identification mark formed by the exposure method using the stepper may be formed on the wiring substrate 12 together with the identification mark 15. Similarly, the identification mark formed by the exposure method using the stepper may be formed in the outer frame together with the identification mark 25.

In the above embodiment, the first surfaces 42A of the via wirings 42 and the first surfaces 43A of the via wirings 43 are formed to be flush with the first surface 31A of the insulation layer 31. Instead, for example, the first surfaces 42A and 43A of the via wirings 42 and 43 may be formed to be recessed toward the inner side of the insulation layer 31 further than the first surface 31A of the insulation layer 31. Alternatively, the first surfaces 42A and 43A of the via wirings 42 and 43 may be formed to protrude toward the outside (the lower side in FIG. 2B) further than the first surface 31A of the insulation layer 31.

In the above embodiment, the via wirings 42 (identification mark 15) are formed at the chip mounting surface side. Instead, for example, the via wirings 42 (identification mark 15) may be formed at the external connection terminal surface side. Similarly, the via wirings 43 (identification mark 25) may be formed at the external connection terminal surface side. In this case, the wiring substrate is formed in the order opposite to the manufacturing method of the above embodiment. In other words, the wiring layer 36 and the insulation layer 35 are first stacked on the support 70, and thereafter the wiring layer 34, the insulation layer 33, the wiring layer 32, the insulation layer 31, and the wiring layer 30 are sequentially stacked.

In the above embodiment, the metallic film 71 may not be formed.

In the above embodiment, the entire first surface 30A of the wiring layer 30 may be exposed from the openings 38X of the solder resist layer 38 as the connection pads P1.

In the above embodiment, the number of the wiring layers 30, 32, 34, and 36 and the insulation layers 31, 33, and 35 in the wiring substrates 12 and 12A or the wiring position thereof may be appropriately changed.

The above embodiment has been described in connection with the example in which the semiconductor chip 60 is mounted on the wiring substrate 12A, but the device to be mounted is not limited to the semiconductor chip 60. For example, the present invention may be applied to a package on package having the structure in which another wiring substrate is stacked on the wiring substrate 12A.

In the above embodiment, the number of semiconductor chips mounted on the wiring substrate 12 may be appropriately changed. Further, the mounting method (for example, flip-chip mounting, wire bonding mounting, or a combination thereof) of the semiconductor chip may be appropriately changed.

In the above embodiment, a single wiring substrate 10 having the structure illustrated in FIG. 13B is obtained by stacking a required number of wiring layers and a required number of insulation layers on one surface (the upper surface 70A) of the support 70 mainly using the build-up technique and then removing the support 70. Instead, a plurality of wiring substrates each of which has the structure illustrated in FIG. 13B may be obtained by stacking a required number of wiring layers and a required number of insulation layers on both sides (the upper surface and the lower surface) of the support 70 mainly using the build-up technique and then removing the support 70.

The above embodiment has been described in connection with the wiring substrate 10 having the three blocks 11, but the number of blocks 11 is not particularly limited. For example, the present invention may be applied to the wiring substrate 10 including one or two blocks 11 or the wiring substrate 10 including four or more blocks 11.

In the above embodiment, unit wiring substrates 12 are arranged in the block 11 in the form of a matrix. Instead, for example, unit wiring substrates 12 may be arranged in the block 11 in the form of a band. In other words, when N×M (N is an integer of two or larger, and M is an integer of one or larger) unit wiring substrates 12 are arranged in each of the blocks 11, the arrangement of the unit wiring substrates 12 is not particularly limited.

Clauses

This disclosure further encompasses various embodiments described below.

1. A method of manufacturing a wiring substrate, the method including:
preparing a support;
forming a lowermost wiring layer on the support;
forming a lowermost insulation layer on the support, the lowermost insulation layer covering the lowermost wiring layer;
forming a plurality of via holes and a plurality of through holes, wherein
the via holes extend through the lowermost insulation layer in a thickness direction to expose an upper surface of the lowermost wiring layer, and
the through holes extend through the lowermost insulation layer in the thickness direction to expose the support;
forming a plurality of first via wirings, a plurality of second via wirings, and a wiring layer, wherein
the wiring layer is arranged on the lowermost insulation layer,
the first via wirings are formed in the via holes to electrically connect the wiring layer with the lowermost wiring layer, and
the second via wirings are formed in the through holes to define an identification mark that is identifiable as a specific shape including a character, a symbol, or a combination thereof;
alternately stacking a required number of insulation layers and a required number of wiring layers on the lowermost insulation layer; and
removing the support.

2. The method according to clause 1,
wherein the via holes and the through holes are formed by laser processing.

3. A method of manufacturing a wiring substrate, the method including:
preparing a support, the support including a plurality of substrate forming regions that is adjacent to one another and an outer frame forming region surrounding the substrate forming regions;
forming a lowermost wiring layer on the support in the substrate forming regions;

forming a lowermost insulation layer, which covers the lowermost wiring layer, on the support in the substrate forming regions and the outer frame forming region;
forming a plurality of via holes, a plurality of first through holes, and a plurality of second through holes, wherein
the via holes extend through the lowermost insulation layer in a thickness direction in each of the substrate forming regions to expose an upper surface of the lowermost wiring layer,
the first through holes extend through the lowermost insulation layer in the thickness direction in each of the substrate forming regions to expose the support, and
the second through holes extend through the lowermost insulation layer in the thickness direction in the outer frame forming region to expose the support;
forming a plurality of first via wirings, a plurality of second via wirings, a plurality of third via wirings, and a wiring layer, wherein
the wiring layer is arranged on the lowermost insulation layer,
the first via wirings are formed in the first through holes to define a first identification mark that is identifiable as a specific shape including a character, a symbol, or a combination thereof,
the second via wirings are formed in the second through holes to define a second identification mark that is identifiable as a specific shape including a character, a symbol, or a combination thereof, and
the third via wirings are formed in the via holes to electrically connect the wiring layer with the lowermost wiring layer;
alternately stacking a required number of insulation layers and a required number of wiring layers on the lowermost insulation layer; and
removing the support.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a plurality of wiring layers and a plurality of insulation layers, the wiring layers and the insulation layers being alternately stacked;
a plurality of via holes that is formed in the insulation layers;
a plurality of first via wirings that is formed in the via holes to electrically connect the wiring layers to one another;
a plurality of through holes that extends through a lowermost one of the insulation layers in a thickness direction, the lowermost insulation layer covering a lowermost one of the wiring layers; and
a plurality of second via wirings that is formed in the through holes to define an identification mark, the identification mark being identifiable as a specific shape including a character, a symbol, or a combination thereof,
wherein a lower surface of each of the second via wirings is exposed from a lower surface of the lowermost insulation layer and flush with a lower surface of the lowermost wiring layer.

2. The wiring substrate according to claim 1, wherein
the plurality of wiring layers includes a wiring layer that is formed in a solid shape on an upper surface of the lowermost insulation layer and commonly connected to the second via wirings.

3. The wiring substrate according to claim 1, wherein
the plurality of wiring layers includes a wiring layer that is formed on an upper surface of the lowermost insulation layer, and
the wiring layer on the upper surface of the lowermost insulation layer includes a plurality of wiring patterns, each of the wiring patterns being connected to one of the second via wirings.

4. The wiring substrate according to claim 1, further comprising a solder resist layer that is formed on the lower surface of the lowermost insulation layer, wherein the solder resist layer includes an opening that exposes at least a part of the lower surface of the lowermost wiring layer as a connection pad.

5. The wiring substrate according to claim 1, wherein the lower surface of each of the second via wirings is flush with the lower surface of the lowermost insulation layer.

6. The wiring substrate according to claim 1, wherein each of the via holes includes an upper side opening and a lower side opening and is formed in a tapered shape in which the upper side opening has an opening diameter larger than that of the lower side opening.

7. A semiconductor device comprising:
a wiring substrate according to claim 1; and
a semiconductor chip that is mounted on the lowermost insulation layer side of the wiring substrate.

8. A wiring substrate comprising:
a block including a plurality of unit wiring substrates that is adjacent to one another; and
an outer frame surrounding the block,
wherein each of the unit wiring substrates includes:
  a plurality of wiring layers and a plurality of insulation layers, the wiring layers and the insulation layers being alternately stacked;
  a plurality of first through holes that extends through a lowermost one of the insulation layers in a thickness direction, the lowermost insulation layer covering a lowermost one of the wiring layers; and
  a plurality of first via wirings that is formed in the first through holes to define a first identification mark, the first identification mark being identifiable as a specific shape including a character, a symbol, or a combination thereof,
the outer frame includes:
  the plurality of insulation layers;
  a plurality of second through holes that extends through the lowermost insulation layer in the thickness direction; and
  a plurality of second via wirings that is formed in the second through holes to define a second identification mark, the second identification mark being identifiable as a specific shape including a character, a symbol, or a combination thereof, and
a lower surface of each of the first via wirings and a lower surface of each of the second via wirings are exposed from a lower surface of the lowermost insulation layer and flush with a lower surface of the lowermost wiring layer.

* * * * *